(12) United States Patent
Park et al.

(10) Patent No.: US 12,193,272 B2
(45) Date of Patent: ***Jan. 7, 2025

(54) DISPLAY DEVICE HAVING TRANSISTORS WITH BENT REGIONS AND OTHER TRANSISTORS WITHOUT BENT REGIONS

(71) Applicant: Samsung Display Co., Ltd., Yongin-si (KR)

(72) Inventors: Jin Woo Park, Yongin-si (KR); Won Kyu Kwak, Yongin-si (KR); Dong Wook Kim, Yongin-si (KR); Hyun-Chol Bang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,037

(22) Filed: Aug. 21, 2023

(65) Prior Publication Data

US 2023/0397456 A1 Dec. 7, 2023

Related U.S. Application Data

(63) Continuation of application No. 16/684,944, filed on Nov. 15, 2019, now Pat. No. 11,818,917.

(30) Foreign Application Priority Data

Nov. 15, 2018 (KR) .................. 10-2018-0140835

(51) Int. Cl.
*G09G 3/32* (2016.01)
*G09G 3/20* (2006.01)
(Continued)

(52) U.S. Cl.
CPC ....... *H10K 59/1213* (2023.02); *G09G 3/2003* (2013.01); *G09G 3/3225* (2013.01);
(Continued)

(58) Field of Classification Search
CPC ............. H01L 27/3262; H01L 27/322; H01L 27/3272; G09G 3/2003; G09G 3/32; G09G 3/3225; G09G 2360/145
See application file for complete search history.

(56) References Cited

U.S. PATENT DOCUMENTS

| 5,407,846 A | 4/1995 | Chan |
| 6,940,300 B1 | 9/2005 | Jenkins et al. |
| | (Continued) | |

FOREIGN PATENT DOCUMENTS

| CN | 101005082 | 7/2007 |
| CN | 103324362 | 9/2013 |
| | (Continued) | |

OTHER PUBLICATIONS

Chinese Office Action for Chinese Patent Application or Patent No. 201911117793.4, dated Jan. 16, 2024.
(Continued)

*Primary Examiner* — Pegeman Karimi
(74) *Attorney, Agent, or Firm* — KILE PARK REED & HOUTTEMAN PLLC

(57) ABSTRACT

A display device including a display panel including a plurality of transistors and displaying an image on a front surface thereof; and a sensing module on a rear surface of the display panel, wherein the display panel includes a first region that overlaps the sensing module and a second region that does not overlap the sensing module, a W/L ratio of one of the transistors in the first region is greater than a W/L ratio of another of the transistors in the second region, the W/L ratio being obtained by dividing a width of a channel of the transistor by a length of the channel.

14 Claims, 21 Drawing Sheets

(51) Int. Cl.
  *G09G 3/3225* (2016.01)
  *H10K 59/121* (2023.01)
  *H10K 59/126* (2023.01)
  *H10K 59/38* (2023.01)
  *H10K 59/131* (2023.01)

(52) U.S. Cl.
  CPC ........... *H10K 59/126* (2023.02); *H10K 59/38* (2023.02); *G09G 2360/145* (2013.01); *H10K 59/131* (2023.02)

(56) References Cited

U.S. PATENT DOCUMENTS

| | | | |
|---|---|---|---|
| 7,829,896 | B2 | 11/2010 | Wang et al. |
| 9,117,783 | B2 | 8/2015 | Jin |
| 9,608,050 | B2 | 3/2017 | Jin |
| 9,679,182 | B2 | 6/2017 | Bae et al. |
| 9,748,295 | B2 | 8/2017 | Lee et al. |
| 9,823,771 | B2 | 11/2017 | Bae et al. |
| 9,864,448 | B2 | 1/2018 | Bae et al. |
| 9,891,746 | B2 | 2/2018 | Bae et al. |
| 9,996,179 | B2 | 6/2018 | Bae et al. |
| 10,008,527 | B2 | 6/2018 | Lee et al. |
| 10,038,049 | B2 | 7/2018 | Gang et al. |
| 10,186,191 | B2 | 1/2019 | Kang et al. |
| 10,191,577 | B2 | 1/2019 | Choi et al. |
| 10,229,637 | B2 | 3/2019 | Ka et al. |
| 10,482,811 | B2 | 11/2019 | Kang et al. |
| 10,522,604 | B2 | 12/2019 | Jin |
| 10,878,215 | B2 | 12/2020 | Cho et al. |
| 11,016,349 | B2 | 5/2021 | Kim et al. |
| 11,061,295 | B2 | 7/2021 | Bang et al. |
| 11,487,142 | B2 | 11/2022 | Kim et al. |
| 11,527,592 | B2 | 12/2022 | Shan et al. |
| 2012/0120119 | A1 | 5/2012 | Park et al. |
| 2015/0021561 | A1 | 1/2015 | Jeon |
| 2016/0056225 | A1 | 2/2016 | Lee et al. |
| 2017/0344797 | A1 | 11/2017 | Hsieh et al. |
| 2017/0351364 | A1 | 12/2017 | Kim et al. |
| 2018/0129328 | A1 | 5/2018 | Park et al. |
| 2019/0073946 | A1* | 3/2019 | Su .................... H10K 50/81 |
| 2019/0130822 | A1* | 5/2019 | Jung .................... G09G 3/2003 |
| 2019/0197944 | A1 | 6/2019 | Kim et al. |
| 2019/0293484 | A1 | 9/2019 | Zhang |
| 2019/0362672 | A1* | 11/2019 | Cui .................... G06V 40/1318 |
| 2020/0051497 | A1 | 2/2020 | Kang et al. |
| 2020/0052055 | A1 | 2/2020 | Song et al. |
| 2020/0279090 | A1 | 9/2020 | He et al. |
| 2021/0341778 | A1 | 11/2021 | Bang et al. |

FOREIGN PATENT DOCUMENTS

| | | |
|---|---|---|
| CN | 205899564 | 1/2017 |
| CN | 107039472 | 8/2017 |
| CN | 107452771 | 12/2017 |
| CN | 107664862 | 2/2018 |
| CN | 207264695 | 4/2018 |
| CN | 207587740 | 7/2018 |
| CN | 108364978 | 8/2018 |
| CN | 108538206 | 9/2018 |
| EP | 2 940 495 | 11/2015 |
| EP | 3640716 | 4/2020 |
| JP | H09-160014 | 6/1997 |
| JP | 2010-161096 | 7/2010 |
| KR | 10-1998-0072231 | 11/1998 |
| KR | 10-2003-0057218 | 7/2003 |
| KR | 10-1117644 | 2/2012 |
| KR | 10-2014-0079093 | 6/2014 |
| KR | 10-2014-0140967 | 12/2014 |
| KR | 10-2016-0003993 | 1/2016 |
| KR | 10-2017-0037436 | 4/2017 |
| KR | 10-2017-0065059 | 6/2017 |
| KR | 10-1761547 | 7/2017 |
| KR | 10-2017-0096565 | 8/2017 |
| KR | 10-2018-0011885 | 2/2018 |
| KR | 10-2018-0050473 | 5/2018 |
| WO | 2016/036179 | 3/2016 |

OTHER PUBLICATIONS

Extended European Search Report corresponding to European Application or Patent No. 19209349.0 dated Jun. 24, 2020.
European Office Action for European Patent Application or Patent No. 19 209 349.0, dated Aug. 22, 2022.
Chinese Office Action for Chinese Patent Application or Patent No. 201911117793.4, dated Nov. 2, 2022.
Chinese Office Action for Chinese Patent Application No. 201911117793.4, dated Sep. 19, 2023.
Korean Office Action for Korean Patent Application No. 10-2018-0140835, dated May 9, 2024.

* cited by examiner

FIG. 3

DISPLAY DEVICE HAVING TRANSISTORS WITH BENT REGIONS AND OTHER TRANSISTORS WITHOUT BENT REGIONS

CROSS-REFERENCE TO RELATED APPLICATION

This is a continuation application of U.S. patent application Ser. No. 16/684,944, filed Nov. 15, 2019 (now U.S. Pat. No. 11,818,917), the disclosure of which is incorporated herein by reference in its entirety. U.S. patent application Ser. No. 16/684,944 claims priority to and the benefit of Korean Patent Application No. 10-2018-0140835 under 35 U.S.C. § 119, filed Nov. 15, 2018, in the Korean Intellectual Property Office (KIPO), the disclosure of which is incorporated herein by reference in its entirety for all purposes.

BACKGROUND

1. Field

Embodiments relate to a display device.

2. Description of the Related Art

A display device may display an image by using a pixel (or a pixel circuit). The display device may include an infrared ray sensor on a bezel (or an edge part) of the front side of the display device (e.g., one side where the image is displayed), and may recognize an object by using the infrared ray sensor. For example, the display device may transmit infrared light by using the infrared ray sensor, receive reflected light reflected by the object, calculate the distance between the display device and the object based on the intensity of the reflected light, and omit the display of the image if the distance is within a predetermined distance.

The above information disclosed in this Background section is only for enhancement of understanding and therefore it may contain information that does not form the prior art that is already known in this country to a person of ordinary skill in the art.

SUMMARY

The embodiments may be realized by providing a display device including a display panel including a plurality of transistors and displaying an image on a front surface thereof; and a sensing module on a rear surface of the display panel, wherein: the display panel includes a first region that overlaps the sensing module and a second region that does not overlap the sensing module, a W/L ratio of one of the transistors in the first region is greater than a W/L ratio of another of the transistors in the second region, the W/L ratio being obtained by dividing a width of a channel of the transistor by a length of the channel.

The one transistor in the first region and the other transistor in the second region may be driving transistors.

The display panel may include a plurality of pixels, and a pixel density of the first region may be smaller than a pixel density of the second region.

The pixel density of the first region may be 20% to 90% of the pixel density of the second region.

The first region may include a transmitting region.

An area occupied by a transmitting region may be 20% to 90% of a total area of the first region.

The display panel may further include a first substrate on which the plurality of transistors are disposed, and a light blocking layer between the first substrate and at least one transistor of the plurality of transistors.

The light blocking layer may block infrared rays.

The light blocking layer may be in the first region and not in the second region.

In the first region, the plurality of transistors may include a driving transistor, a switching transistor, and a compensation transistor, and the light blocking layer may overlap the driving transistor and the switching transistor and does not overlap the compensation transistor.

In the first region, the plurality of transistors may include a driving transistor, a switching transistor, and a compensation transistor, and the light blocking layer may overlap all of the driving transistor, the switching transistor, and the compensation transistor.

The display device may further include a color filter layer on the front surface of the display panel, wherein the color filter layer does not overlap the first region.

The display device may further include a transparent layer overlapping the first region.

A luminance of a pixel in the first region may be higher than a luminance of a pixel in the second region.

The embodiments may be realized by providing a display device including a display panel including a plurality of pixels, wherein the display panel includes a first region and a second region, a plurality of pixels being included on the first region and the second region, a pixel density of the first region is smaller than a pixel density of the second region, a W/L ratio of one transistor in the first region is greater than a W/L ratio of another transistor in the second region, the W/L ratio being obtained by dividing a width of a channel of the transistor by a length of the channel.

The display device may further include a sensing module on a rear surface of the display panel, wherein the sensing module overlaps the first region.

The pixel density of the first region may be 20% to 90% of the pixel density of the second region.

The first region may include a transmitting region.

The one transistor in the first region and the other transistor in the second region may be driving transistors.

The display panel may further include a first substrate on which the one transistor in the first region and the other transistor in the second region are disposed, and a light blocking layer between the first substrate and at least one of the one transistor or the other transistor.

The light blocking layer may be only in the first region and not in the second region.

The display device may further include a color filter layer on a front surface of the display panel, the color filter layer not overlapping the first region, and a transparent layer overlapping the first region.

A luminance of one pixel in the first region may be higher than a luminance of one pixel in the second region.

The embodiments may be realized by providing a display device including a display panel including a plurality of pixels and displaying an image on a front surface thereof; and a sensing module on a rear surface of the display panel, wherein the display panel includes a first region that overlaps the sensing module and a second region that does not overlap the sensing module, and a luminance of one pixel in the first region is higher than a luminance of one pixel in the second region.

The display panel may include a plurality of pixels, and a W/L ratio of one transistor in the first region may be greater than a W/L ratio of another transistor in the second region, the W/L ratio being obtained by dividing a width of a channel of the transistor by a length of the channel.

A pixel density of the first region may be smaller than a pixel density of the second region.

The display panel may further include a first substrate on which a plurality of transistors are disposed, and a light blocking layer between the first substrate and at least one transistor of the plurality of transistors.

The light blocking layer may be in the first region and not in the second region.

The display device may further include a color filter layer on the front surface of the display panel, the color filter layer not overlapping the first region, and a transparent layer overlapping the first region.

BRIEF DESCRIPTION OF THE DRAWINGS

Features will be apparent to those of skill in the art by describing in detail exemplary embodiments with reference to the attached drawings in which:

FIG. 3 illustrates a view showing a pixel arrangement of a first region and a second region in a display device according to an exemplary embodiment.

DETAILED DESCRIPTION

Figure 1:
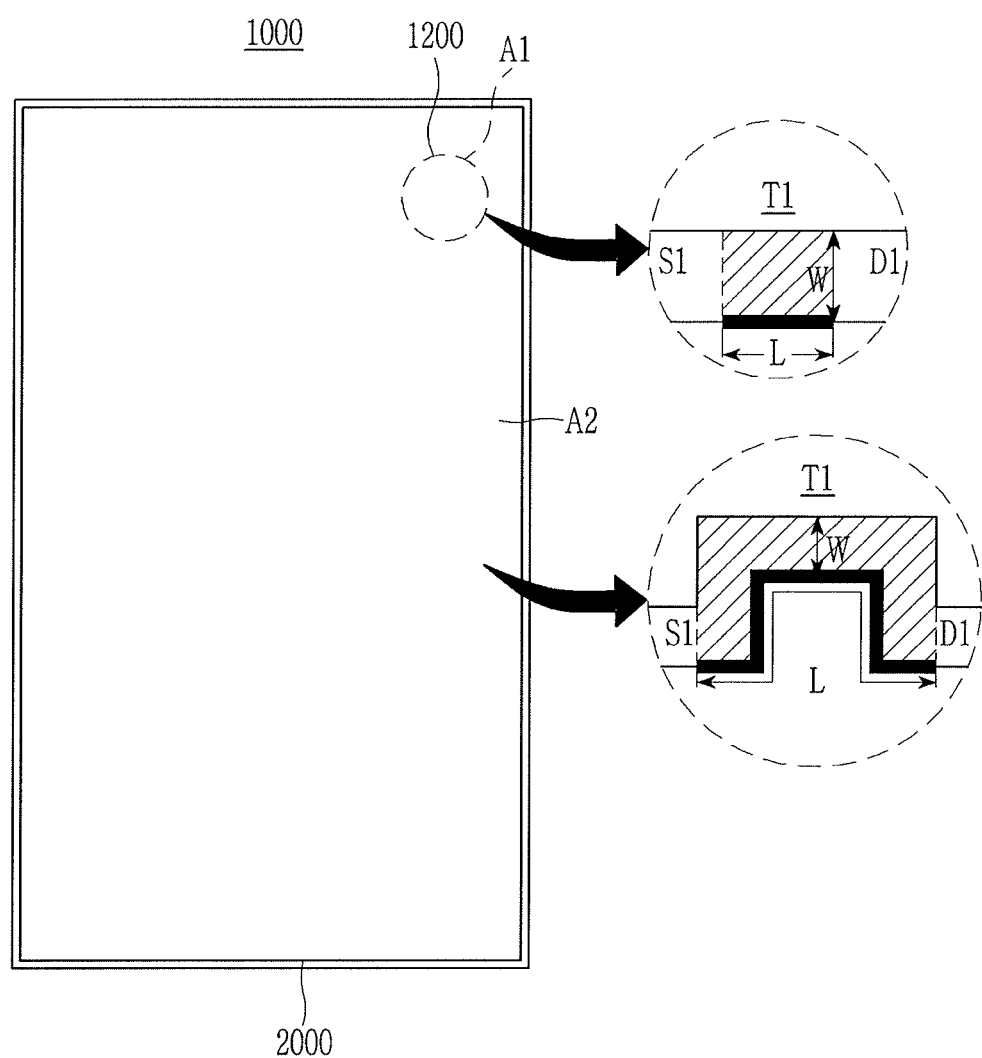
FIG. 1 and FIG. 2 illustrate views schematically showing a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "includes," "including," "comprises," or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Figure 2:
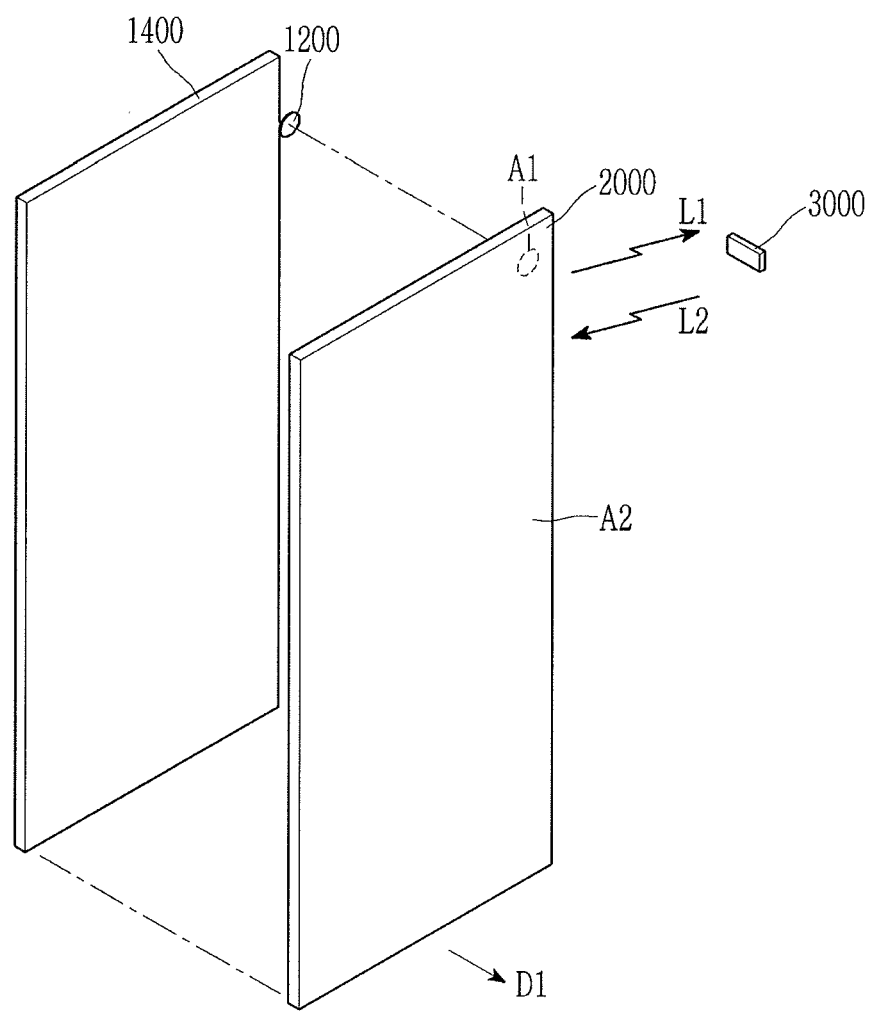

A display device according to an exemplary embodiment will now be described in detail with reference to accompanying drawings. FIG. 1 and FIG. 2 illustrate views schematically showing a display device according to an exemplary embodiment.

Referring to FIG. 1, a display device 1000 according to an exemplary embodiment may include a display panel 2000 and a sensing module 1200.

The display panel 2000 may be an organic light emitting panel including an organic light emitting element. The display panel 2000 may include a first region A1 that overlaps the sensing module 1200 and a second region A2 that does not overlap the sensing module 1200 (e.g., surrounding the sensing module 1200).

The display panel 2000 displays an image, and the image may be on an entire front surface (e.g., the surface in the first direction D1 shown in FIG. 2) of the display panel 2000. For example, the display panel 2000 may not include a bezel or a non-display area on or surrounding the entire surface.

The sensing module 1200 may be on a rear surface of the display panel 2000, e.g., a surface in the opposite direction to the first direction D1 of the display panel 2000. For example, the sensing module 1200 may be between the display panel 2000 and a case 1400 (or a cover). Here, the case 1400 may constitute or define an external shape of the display device 1000, and may help protect internal constituent elements (e.g., a battery and a memory device) from external stress.

In an implementation, the sensing module 1200 may include, e.g., an infrared ray sensing module.

Referring to FIG. 2, when the sensing module 1200 is an infrared ray sensing module, a first infrared ray light L1 may be transmitted, a second infrared ray light L2 may be received, and an object 3000 may be recognized based on a change of the second infrared ray light L2. For example, the first infrared ray light L1 may travel in the first direction D1 and may pass through the first region A1 of the display panel 2000. The second infrared ray light L2 may include reflected light of the first infrared ray light L1 that has been reflected by the object 3000 and travels in the opposite direction to the first direction D1, and may transmit back to the first region A1 of the display panel 2000.

When the sensing module 1200 is an infrared ray imaging element, it may recognize a specific pattern (e.g., a fingerprint pattern, an iris pattern, or the like) from an infrared ray image. In an implementation, the sensing module 1200 may perform face recognition.

Referring to FIG. 1, a channel size of a driving transistor T1 may be different in the first region A1 and the second region A2 of the display panel 2000. In FIG. 1, the channel region of each driving transistor T1 is shown with a slash line (e.g., crosshatching). As shown in FIG. 1, in the first region A1, the length L of the channel of the driving transistor T1 may be shorter than that of the driving transistor T1 of the second region A2. The length of the channel refers to the length of a part indicated by a thick line shown in FIG. 1. For example, the length L of the channel does not mean only the width of the channel (e.g., in a single direction), but rather a total length of (one side) of the channel region (e.g., a length of a path through the channel region). In an implementation, the width W of the channel of the driving transistor of the first region A1 may be wider than the width W of the channel of the driving transistor T1 in the second region A2.

In an implementation, a W/L (the width of the channel/the length of the channel) value of the channel of the driving transistor in the first region A1 may be larger than a W/L value of the channel of the driving transistor in the second region A2. A current amount flowing in each transistor may be proportional to the W/L value of the channel. For example, when the same voltage is applied to the entire display panel 2000, the current amount flowing in the driving transistor of the first region A1 may become larger. For example, a luminance of the light-emitting element in the first region A1 may be higher than a luminance of the light-emitting element in the second region A2.

Figure 3:
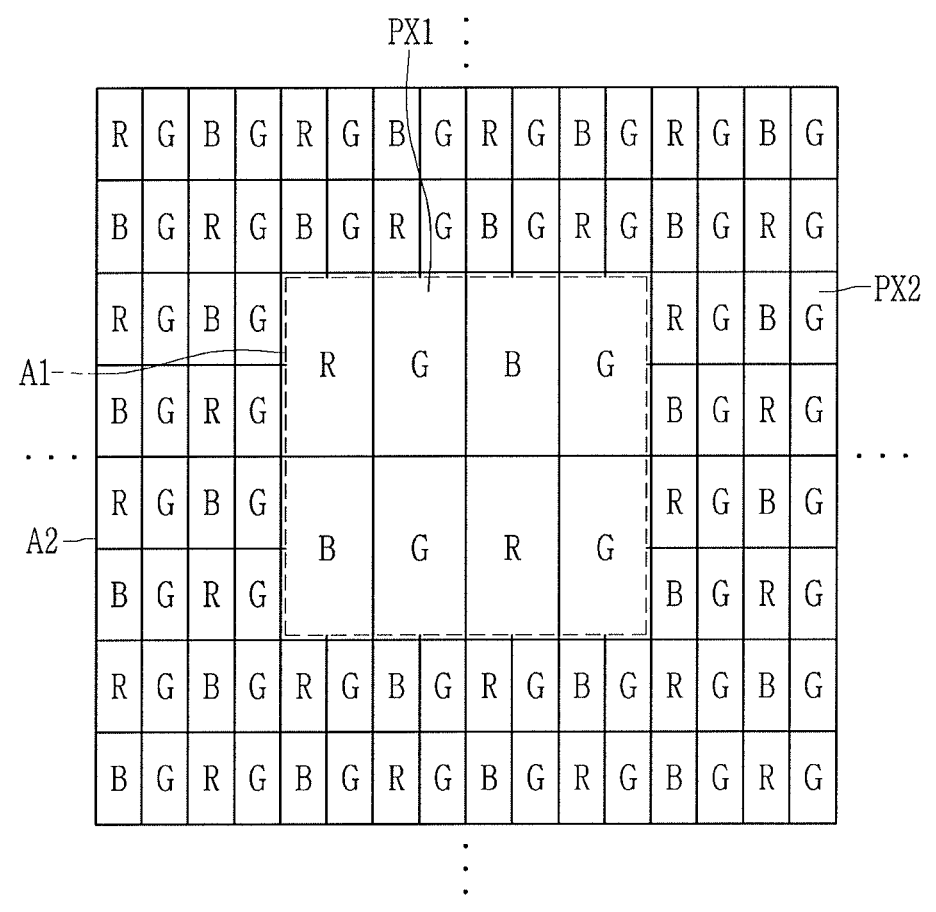

FIG. 3 illustrates a view showing a pixel arrangement of a first region A1 and a second region A2 in a display device according to an exemplary embodiment. Referring to FIG. 3, a first pixel density of the first region A1 may be lower than a second pixel density of the second region A2. The pixel in the present specification is defined as the region shown by a dotted line in FIG. 8. In the present specification, the pixel density refers to a number of pixels in a same unit area.

For example, a size of a first pixel PX1 in the first region A1 may be larger than a size of a second pixel PX2 in the second region A2. For example, the size of the first pixel PX1 may be four times the size of the second pixel PX2. The first pixel PX1 and the second pixel PX2 may contain the same pixel circuit (e.g., may have the same pixel circuit structure), but the first pixel PX1 may further include a space (e.g., a space where transmitted light is not blocked and/or reflected by constituent elements or as a space where constituent elements such as wires and transistors are not disposed so that light may pass therethrough).

The pixel structure of FIG. 3 is a structure to help increase the transmittance of the infrared ray light since the first infrared ray light L1 and the second infrared ray light L2 of the sensing module 1200 may be transmitted in or through the first region A1. For example, the pixel density of the first region A1 may be lower than that of the second region A2, and the infrared ray light of the sensing module 1200 may be received and transmitted (e.g., emitted) by transmitting through the display panel 2000.

In an implementation, the pixel density of the first region A1 may be 20% to 90% of the pixel density of the second region A2. In an implementation, the pixel density of the first region A1 may be 25% to 50% of the pixel density of the second region A2. For example, if the pixel density in the first region A1 is sufficiently low, the transmittance of the infrared ray light may be increased. If the pixel density of the first region A1 were to be too low, the display quality could be different due to the pixel density difference in the first region A1 and the second region A2. For example, the first region A1 having the lower pixel density may be darker than the second region A2.

In an implementation, as shown in FIG. 1, in the display device according to the present exemplary embodiment, the W/L value of the channel of the driving transistor T1 in the first region A1 may be larger than the W/L value of the channel of the driving transistor T1 in the second region A2. Thus, when a same voltage is applied to the entire display panel 2000, the luminance of the light-emitting element in the first region A1 may be higher. Thus, the above-described darker display of the first region A1 relative to the second region A2 by the pixel density difference may be compensated for, and a luminance difference in the first region A1 and the second region A2 may be minimized.

Figure 4:
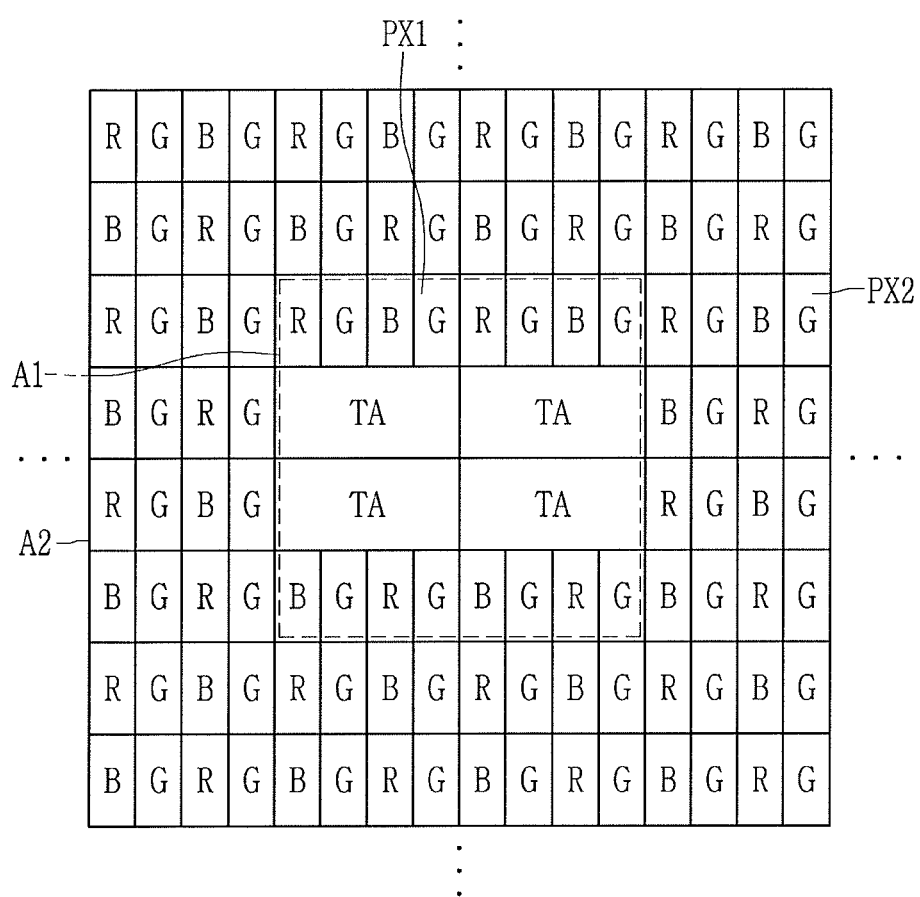
FIG. 4 illustrates a view showing a pixel arrangement of a first region and a second region in a display device according to another exemplary embodiment.

Referring to FIG. 4, the first region A1 may include a transmitting region TA (or a transmitting window). Here, the transmitting region TA may have higher transmittance than the second region A2.

For example, the transmitting region TA may be adjacent to sub-pixels R, G, and B, and a pixel circuit (e.g., electrodes, wires, transistors, etc.) may not be in the light transmitting region TA. For example, an area of the transmitting region TA may occupy from about 20% to about 90% of the first region A1. In an implementation, the pixel density of the first region A1 may be 25% to 50% of the pixel density of the second region A2. For example, the first region A1 may be partially transparent. Therefore, most of the first infrared ray light L1 incident on the transmitting region TA may pass through the transmitting region TA. In FIG. 4, like in FIG. 3, the luminance difference due to the pixel density difference between the first region A1 and the second region A2 could occur. However, as described above, the display device according to the present exemplary embodiment adjusts the W/L value of the channel of the driving transistor T1 in the first region A1 to be larger than that of the second region A2, so that the luminance of the light-emitting element in the first region A1 is high. Therefore, the luminance difference in the first region A1 and the second region A2 may be minimized.

Figure 5:
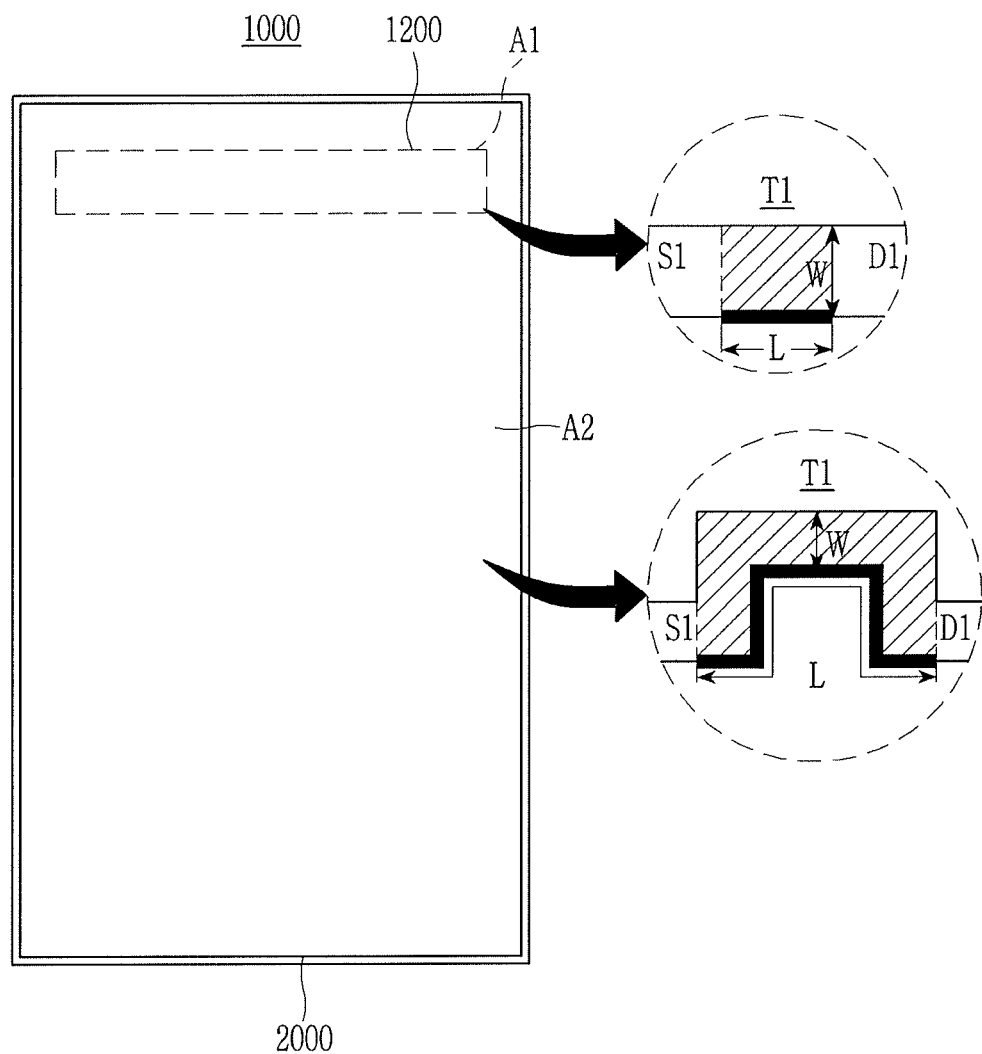
FIG. 5 to FIG. 7 illustrate views of a display device according to various exemplary embodiments.
Figure 6:
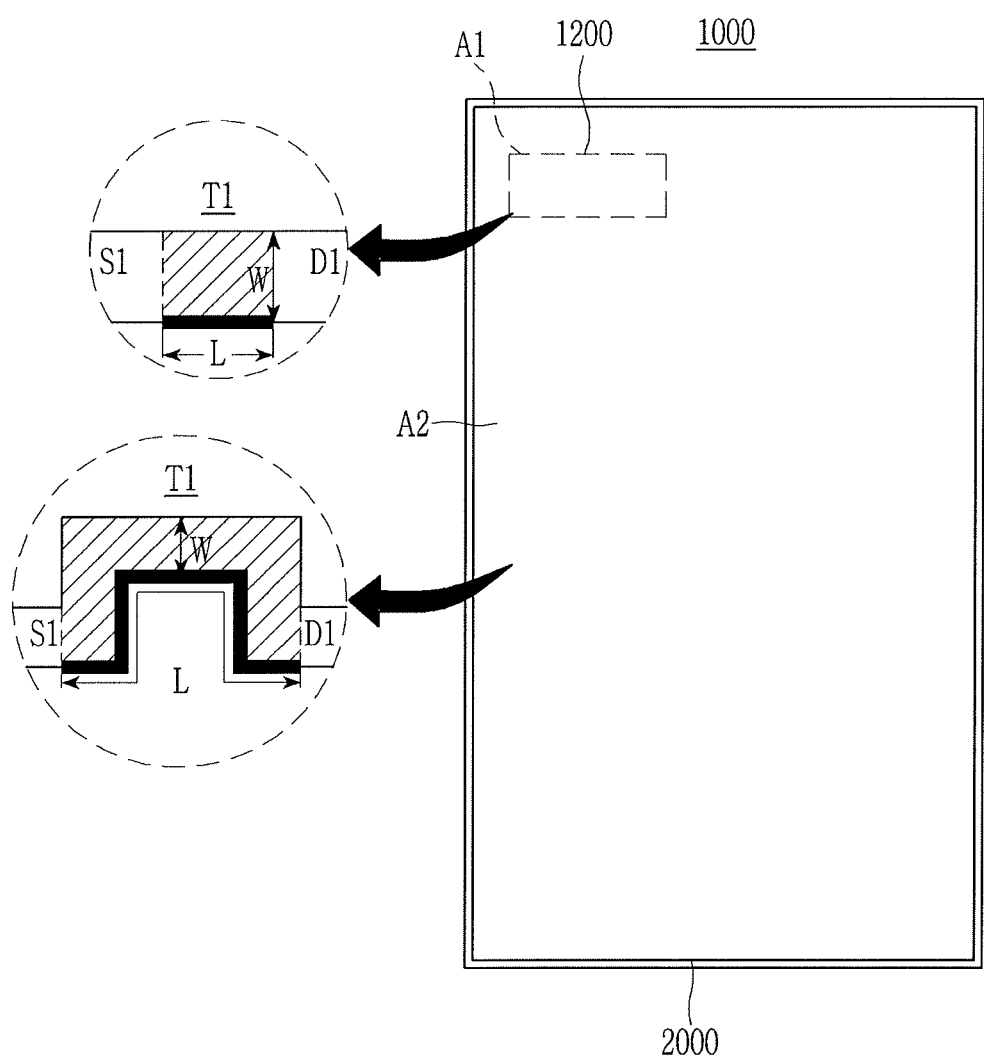
Figure 7:
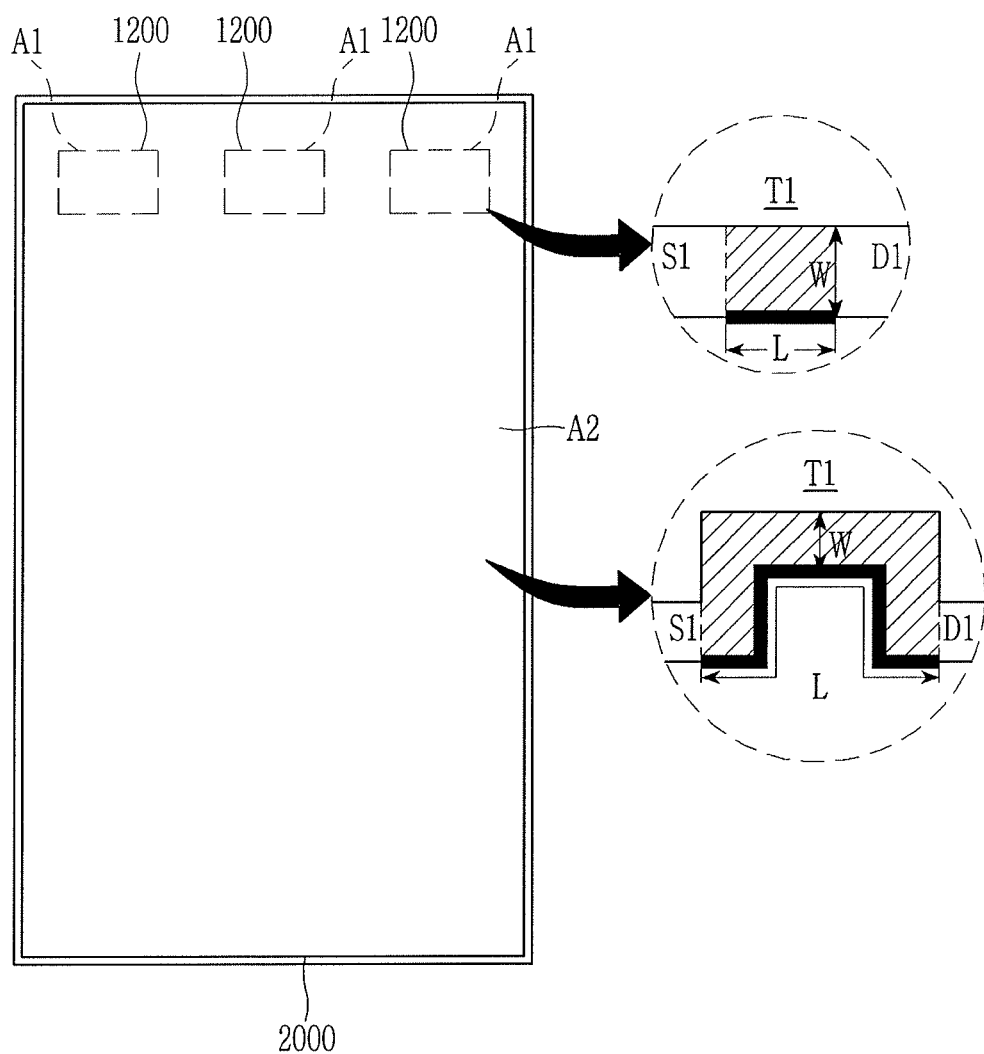

In an implementation, as illustrated in FIG. 1, the first region A1 may be a circular region. FIG. 5 to FIG. 7 illustrate display devices according to various exemplary embodiments. Referring to FIG. 5, in the display device according to the present exemplary embodiment, the first region A1 may have a shape of a horizontally long rectangle. For example, it may have a bar shape across the top of the display panel 2000. In an implementation, as illustrated in FIG. 5 the first region A1 may be at a top (e.g., one end) of the display panel 2000. In an implementation, the first region A1 may be at a side of the display panel. In an implementation, if the display panel 2000 has a curved side surface, the first region A1 may be on the curved side surface of the display panel 2000. Referring to FIG. 6, the first region A1 may have a quadrangular shape. In an implementation, as illustrated in FIG. 6, the first region A1 may be at an upper left of the display panel 2000. In an implementation, the first region A1 may be in any region of the display panel 2000. In an implementation, as illustrated in FIG. 1, the first region A1 may be at the upper right of the display panel 2000. In an implementation, the first region A1 may be disposed in any region of the display panel 2000. Referring to FIG. 7, there may be multiple first regions A1. In an implementation, as shown in FIG. 7, the multiple first regions A1 may be separated or spaced apart from each other at the upper part of the display panel 2000. In an implementation, a plurality of first regions A1 may be freely disposed or arranged in any region of the display panel 2000.

Figure 8:
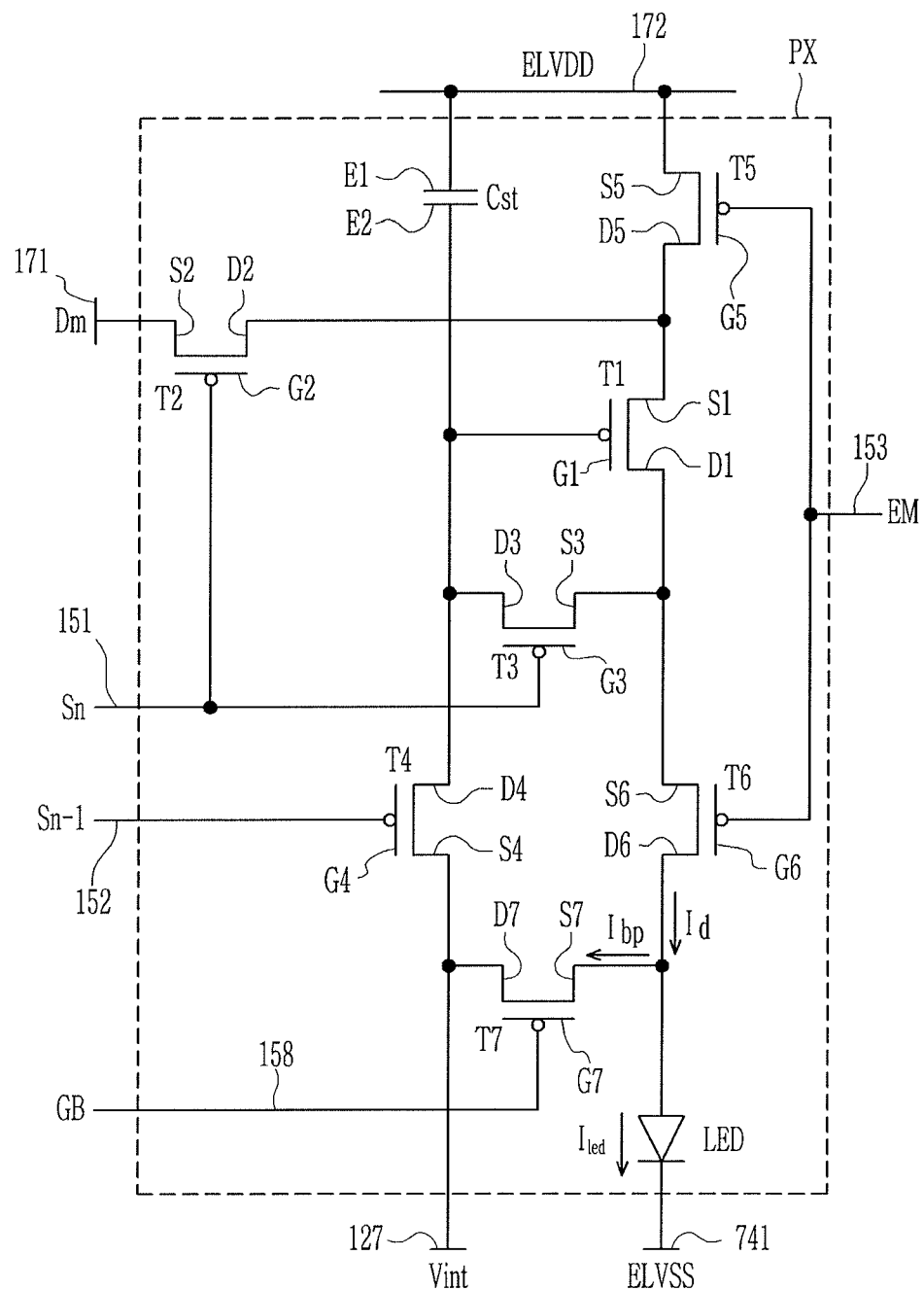
FIG. 8 illustrates an equivalent circuit diagram of one pixel disposed on a first region in a display device according to an exemplary embodiment.
Figure 9:
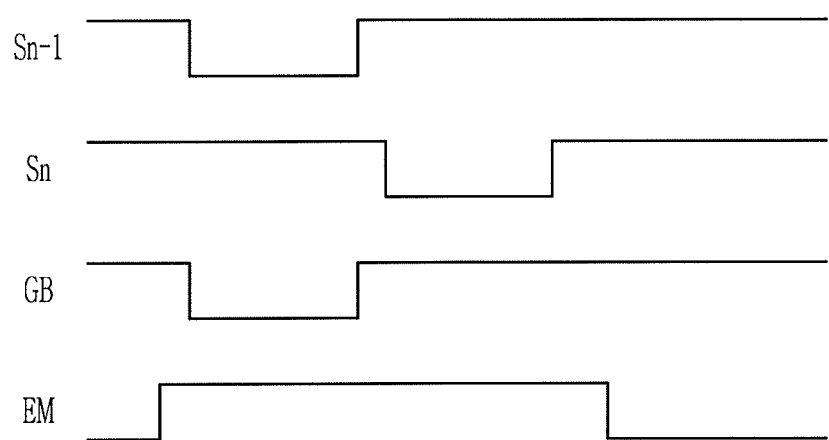
FIG. 9 illustrates a timing diagram of a signal applied to one pixel of a display device according to an exemplary embodiment.

FIG. 8 illustrates an equivalent circuit diagram of one pixel on a first region A1 in a display device according to an exemplary embodiment, and FIG. 9 illustrated a timing diagram of a signal applied to one pixel of a display device according to an exemplary embodiment.

Referring to FIG. 8, the pixel PX of the emissive display device includes a plurality of transistors T1, T2, T3, T4, T5, T6, and T7, a storage capacitor Cst, and a light emitting diode (LED) LED, which are connected to signal lines 127, 151, 152, 153, 158, 171, 172, and 741.

The emissive display device includes a display area in which the image is displayed, and the pixel PX is arranged in various forms in the display area.

The plurality of transistors T1, T2, T3, T4, T5, T6, and T7 include a driving transistor T1, and include a switching transistor connected to a scan line 151, namely a second transistor T2 and a third transistor T3, and the other transistors are transistors (hereinafter referred to as compensation transistors) for performing an operation required to operate the light emitting diode LED. These compensation transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include the scan line 151, a previous scan line 152, a light emission control line 153, a bypass control line 158, a data line 171, a driving voltage line 172, an initialization voltage line 127, and a common voltage line 741. The bypass control line 158 may be a part of the previous scan line 152 or may be electrically connected to the previous scan line 152. Also, the bypass control line 158 may be a part of the scan line 151 or may be electrically connected to the scan line 151.

The scan line 151 is connected to the gate driver to transmit a scan signal Sn to the second transistor T2 and the third transistor T3. The previous scan line 152 is connected to the gate driver to transmit a previous scan signal S(n−1) applied to the pixel PX disposed at the previous stage to the fourth transistor T4. The light emission control line 153 is connected to the light emission controller, and transmits a light emission control signal EM controlling a time that the light emitting diode (LED) LED is emitted to the fifth transistor T5 and the sixth transistor T6. The bypass control line 158 transmits a bypass signal GB to the seventh transistor T7.

The data line 171 is a wire transmitting a data voltage Dm generated by the data driver, and a luminance at which the light emitting diode LED (also referred to as a light-emitting element) emits is changed depending on the data voltage Dm. The driving voltage line 172 applies the driving voltage ELVDD. The initialization voltage line 127 transmits an initialization voltage Vint which initializes the driving transistor T1. The common voltage line 741 applies a common voltage ELVSS. The voltage applied to the driving voltage line 172, the initialization voltage line 127, and the common voltage line 741 may be a constant voltage, respectively.

Hereinafter, a plurality of transistors will be described.

The driving transistor T1 is a transistor adjusting the magnitude of the current output according to the data voltage Dm. The output driving current Id is applied to the light emitting diode LED to adjust the brightness of the light emitting diode (LED) according to the data voltage Dm. For this purpose, the first electrode S1 of the driving transistor T1 is disposed to receive the driving voltage ELVDD. The first electrode S1 is connected to the driving voltage line 172 via the fifth transistor T5. In addition, the first electrode S1 of the driving transistor T1 is connected to the second electrode D2 of the second transistor T2, so that the data voltage Dm is also received. The second electrode D1 (the output electrode) of the driving transistor T1 is disposed to output the current towards the light emitting diode LED. The second electrode D1 of the driving transistor T1 is connected to the anode of the light emitting diode LED via the sixth transistor T6. On the other hand, the gate electrode G1 is connected to one electrode (the second storage electrode E2) of the storage capacitor Cst. Therefore, the voltage of the gate electrode G1 changes according to the voltage stored in the storage capacitor Cst, and the driving current Id output from the driving transistor T1 is changed accordingly.

The second transistor T2 is a transistor that receives the data voltage Dm into the pixel PX. The gate electrode G2 is connected to the scan line 151 and the first electrode S2 is connected to the data line 171. The second electrode D2 of the second transistor T2 is connected to the first electrode S1 of the driving transistor T1. When the second transistor T2 is turned on according to the scan signal Sn transmitted through the scan line 151, the data voltage Dm transmitted through the data line 171 is transmitted to the first electrode S1 of the driving transistor T1.

The third transistor T3 is a transistor that allows the compensation voltage (the voltage of Dm+Vth), of which the data voltage Dm is changed through the driving transistor T1, to be transmitted to the second storage electrode E2 of the storage capacitor Cst. The gate electrode G3 is connected to the scan line 151 and the first electrode S3 is connected to the second electrode D1 of the driving transistor T1. The second electrode D3 of the third transistor T3 is connected to the second storage electrode E2 of the storage capacitor Cst and the gate electrode G1 of the driving transistor T1. The third transistor T3 is turned on according to the scan signal Sn transmitted through the scan line 151 to connect the gate electrode G1 of the driving transistor T1 to the second electrode D1, and the second electrode D1 of the driving transistor T1 to the second storage electrode E2 of the storage capacitor Cst.

The fourth transistor T4 serves to initialize the gate electrode G1 of the driving transistor T1 and the second storage electrode E2 of the storage capacitor Cst. The gate electrode G4 is connected to the previous scan line 152, and the first electrode S4 is connected to the initialization voltage line 127. The second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transmits the initialization voltage Vint to the gate electrode G1 of the driving transistor T1 and the second storage electrode E2 of the storage capacitor Cst according to the previous scan signal S(n−1) transmitted through the previous scan line 152. Thus, the gate voltage of the gate electrode G1 of the driving transistor T1 and the storage capacitor Cst are initialized. The initialization voltage Vint has a low voltage value, thereby turning on the driving transistor T1.

The fifth transistor T5 serves to transmit the driving voltage ELVDD to the driving transistor T1. The gate electrode G5 is connected to the light emission control line 153 and the first electrode S5 is connected to the driving voltage line 172. The second electrode D5 of the fifth transistor T5 is connected to the first electrode S1 of the driving transistor T1.

The sixth transistor T6 serves to transmit the driving current Id output from the driving transistor T1 to the light emitting diode LED. The gate electrode G6 is connected to the light emission control line 153 and the first electrode S6 is connected to the second electrode D1 of the driving transistor T1. The sixth electrode D6 of the sixth transistor T6 is connected to the anode of the light emitting diode LED.

The fifth transistor T5 and the sixth transistor T6 are simultaneously turned on according to the light emission control signal EM transmitted through the light emission control line 153, and when the driving voltage ELVDD is applied to the first electrode S1 of the driving transistor T1 through the fifth transistor T5, the driving transistor T1 outputs the driving current Id according to the voltage (i.e., the voltage of the second storage electrode E2 of the storage capacitor Cst) of the gate electrode G1 of the driving transistor T1. The output driving current Id is transmitted to the light emitting diode LED through the sixth transistor T6. The light emitting diode LED emits light as a current $I_{led}$ a flows through the light emitting diode LED.

The seventh transistor T7 serves for initializing the anode of the light emitting diode LED. The gate electrode G7 is connected to the bypass control line 158, the first electrode S7 is connected to the anode of the light emitting diode LED, and the second electrode D7 is connected to the initialization voltage line 127. The bypass control line 158 may be connected to the previous scan line 152, and the bypass signal GB is applied with the signal of the same timing as the previous scan signal S(n−1). The bypass control line 158 may not be connected to the previous scan line 152 and may transmit a signal different from the previous scan signal S(n−1). When the seventh transistor T7 turns on according to the bypass signal GB, the initialization voltage Vint is applied to the anode of the LED to initialize it.

The first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1 and receives the data voltage Dm through the second electrode D3 of the third transistor T3 or the initialization voltage Vint through the second electrode D4 of the fourth transistor T4.

On the other hand, the anode of the light emitting diode LED is connected to the second electrode D6 of the sixth transistor T6 and the first electrode S7 of the seventh transistor T7, and the cathode is connected to the common voltage line 741 which transmits the common voltage ELVSS.

In an implementation, as illustrated in FIG. 8, the pixel circuit may include seven transistors T1-T7 and one capacitor Cst. In an implementation, the number of transistors, the number of capacitors, and their connections may be variously changed.

The operation of one pixel of the emissive display device according to an exemplary embodiment is now described with reference to FIG. 8 and FIG. 9.

During an initialization period, the previous scan signal S(n−1) at the low level is supplied to the pixel PX through the previous scan line 152. Then, as the fourth transistor T4 is turned on, and the initialization voltage Vint is applied to the gate electrode G1 of the driving transistor T1 and the second storage electrode E2 of the storage capacitor Cst through the fourth transistor T4. As a result, the driving transistor T1 and the storage capacitor Cst are initialized. The initialization voltage Vint has the low voltage, so that the driving transistor T1 may be turned on.

During the initialization period, the bypass signal GB of the low level is also applied to the seventh transistor T7. Thus, as the seventh transistor T7 is turned on, the initialization voltage Vint is applied to the anode of the light emitting diode LED through the seventh transistor T7. As a result, the anode of the light emitting diode LED is also initialized.

Then, the scan signal Sn of the low level is supplied to the pixel PX through scan line 151 during a data writing period. The second transistor T2 and the third transistor T3 are turned on by the scan signal Sn of the low level.

If the second transistor T2 is turned on, the data voltage Dm is input to the first electrode S1 of the driving transistor T1 via the second transistor T2.

Also, during the data writing period, the third transistor T3 is turned on, and as a result, the second electrode D1 of the driving transistor T1 is electrically connected to the gate electrode G1 and the second storage electrode E2 of the storage capacitor Cst. The gate electrode G1 and the second electrode D1 of the driving transistor T1 are connected with a diode connection. During the initialization period, the gate electrode G1 is applied with the low voltage (the initialization voltage Vint) so that the driving transistor T1 is in the turned-on state. As a result, the data voltage Dm input to the first electrode S1 of the driving transistor T1 is output from the second electrode D1 after passing through the channel of the driving transistor T1, and then stored in the second storage electrode E2 of the storage capacitor Cst through the third transistor T3.

At this time, the voltage applied to the second storage electrode E2 is changed according to the threshold voltage Vth of the driving transistor T1, and when the data voltage Dm is applied to the first electrode S1 of the driving transistor T1 and the initialization voltage Vint is applied to the gate electrode G1 of the driving transistor T1, the voltage output to the second electrode D1 may be (Vgs+Vth). Here, Vgs is the difference between the voltages applied to the gate electrode G1 and the first electrode S1 of the driving transistor T1, thereby having a value of (Dm−Vint). Therefore, the voltage output from the second electrode D1 and stored in the second storage electrode E2 may have a value of (Dm−Vint+Vth).

Then, during the light emission period, the light emission control signal EM supplied from the light emission control line 153 has the low level value, so the fifth transistor T5 and the sixth transistor T6 are turned on. As a result, the driving voltage ELVDD is applied to the first electrode S1 of the driving transistor T1 and the second electrode D1 of the driving transistor T1 is connected with the light emitting diode LED. The driving transistor T1 generates a driving current Id according to the voltage difference between the voltage of the gate electrode G1 and the voltage (i.e., driving voltage ELVDD) of the first electrode S1. The driving current Id of the driving transistor T1 may have a value that is proportional to the square of (Vgs−Vth). Here, the value of Vgs is equal to the voltage difference applied to both terminals of the storage capacitor Cst, and the value Vgs is the value of (Vg−Vs), so it has the value of (Dm−Vint+Vth−ELVDD). Here, when the value of Vgs−Vth is obtained by subtracting the value of Vth, the value of (Dm−Vint−ELVDD) is obtained. That is, the driving current Id of the driving transistor T1 has the current that is independent of the threshold voltage Vth of the driving transistor T1 as the output.

Therefore, although the driving transistors T1 disposed in each pixel PX have the different threshold voltages Vth due to a process distribution, the output current of each driving transistor T1 may be constant, thereby improving a non-uniformity characteristic thereof.

In the above equation, the value Vth may be slightly larger than 0 or a negative value in the case of the P-type transistor using the polycrystalline semiconductor. Also, expressions of + and − may be changed according to a direction in which the voltage is calculated. However, there is no change in the point that the driving current Id as the output current of the driving transistor T1 may have a value that does not depend on the threshold voltage Vth.

When the above-described light emission period is ended, the initialization period is again started and the same operations are repeated from the beginning.

For the first electrode and the second electrode of the plurality of transistors T1, T2, T3, T4, T5, T6, and T7, one may be the source electrode and the other may be the drain electrode according to the direction of the application of the voltage or the current.

On the other hand, according to an exemplary embodiment, while the seventh transistor T7 in the initialization period initializes the anode of the light emitting diode LED, a small amount of the current emitted in the condition that the driving transistor T1 is turned on may also be prevented from flowing toward the light emitting diode LED. In this case, the small amount of current is discharged as a bypass current Ibp to the initialization voltage Vint terminal through the seventh transistor T7. As a result, as the light emitting diode LED does not emit unnecessary light, a black gray may be further clearly displayed, and a contrast ratio may also be improved. In this case, the bypass signal GB may be a signal of different timing from that of the previous scan signal S(n−1). In an implementation, the seventh transistor T7 may be omitted.

Figure 10:
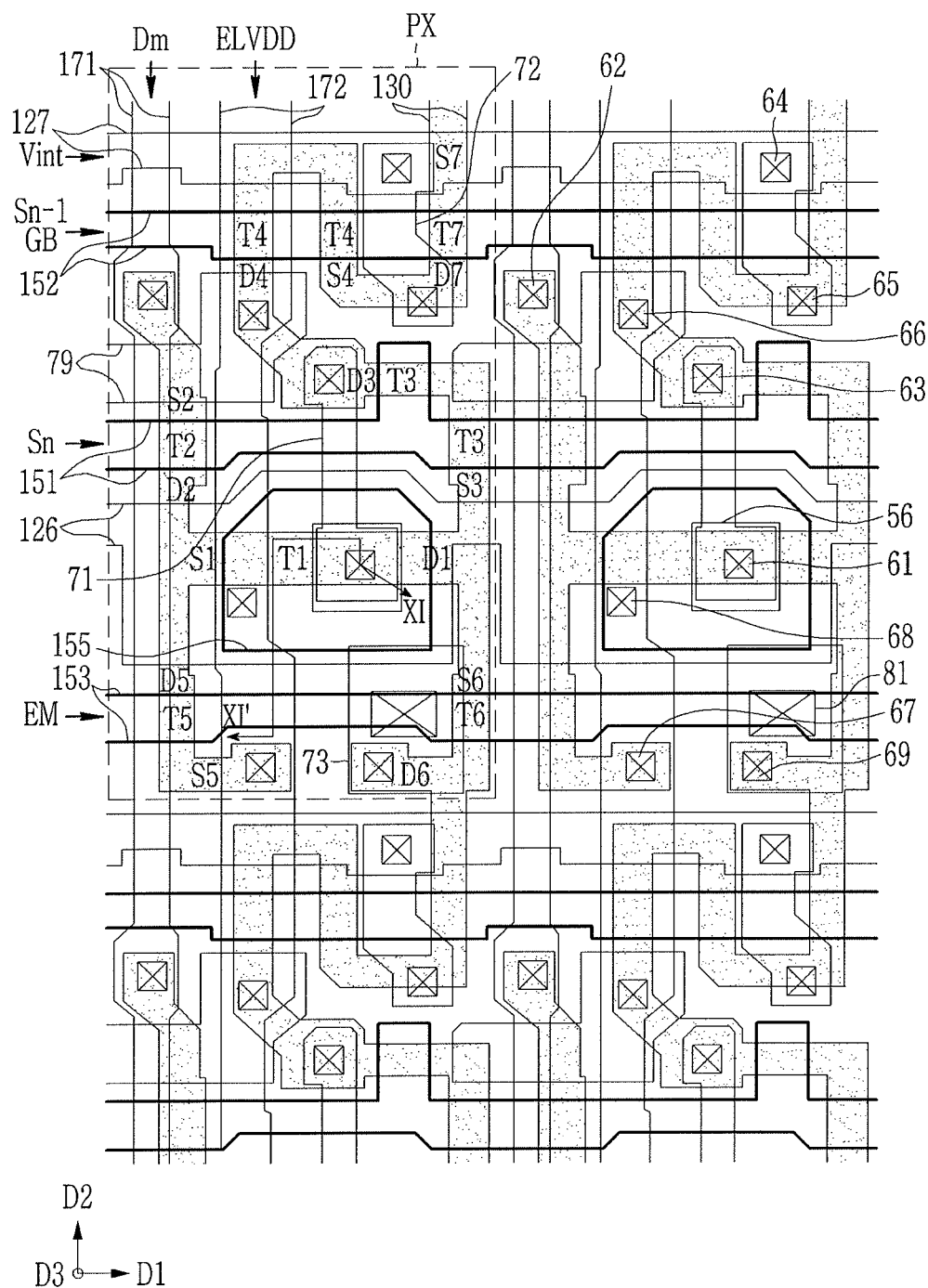
FIG. 10 illustrates a layout view of a pixel in a first region of a display device according to an exemplary embodiment.
Figure 11:
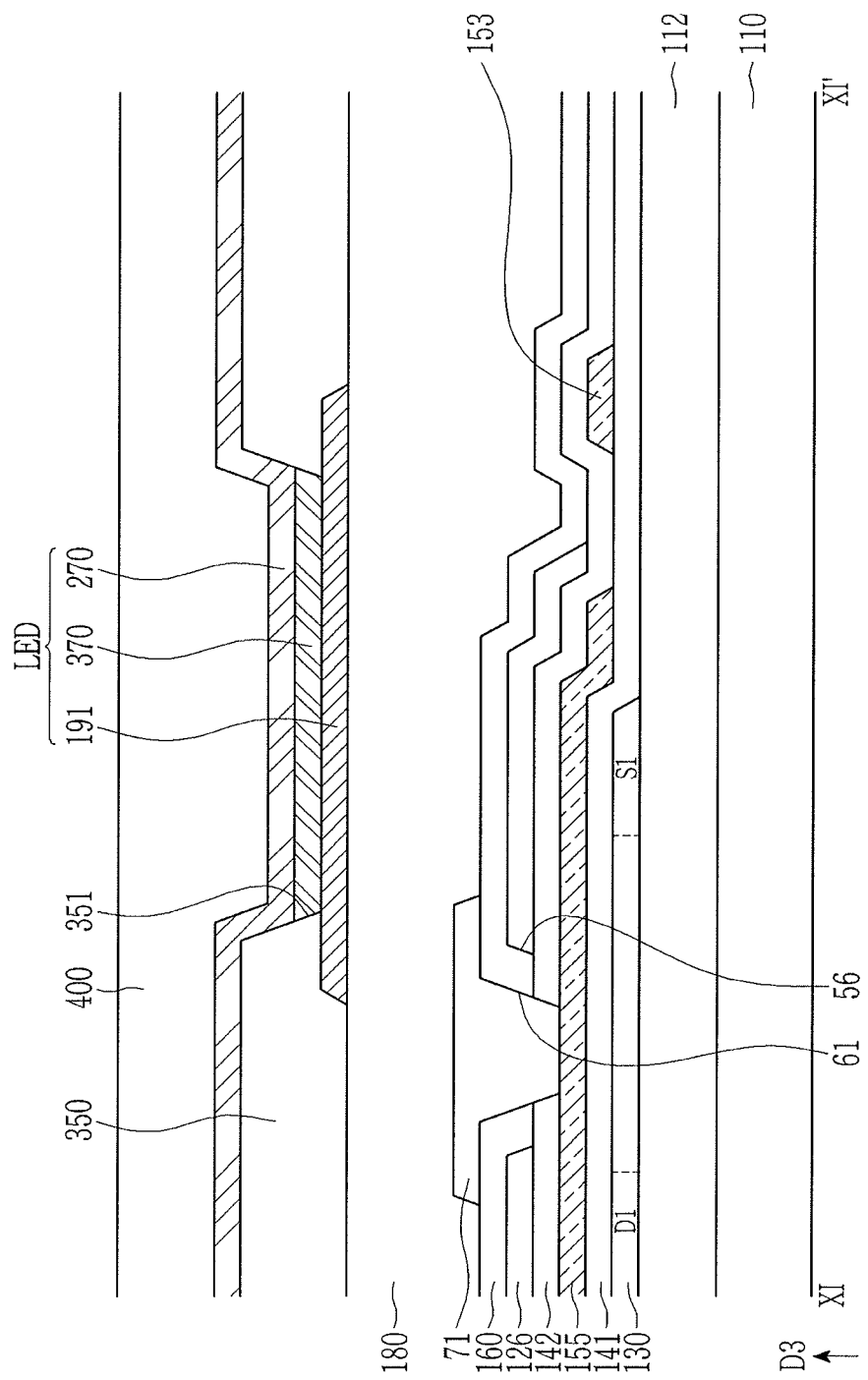
FIG. 11 illustrates a cross-sectional view taken along a line XI-XI' in FIG. 10.

Next, the pixel of the emissive display device according to an exemplary embodiment is described with reference to FIG. 10 and FIG. 11 along with FIG. 8 and FIG. 9. FIG. 10 illustrates a layout view of a pixel in a first region of a display device according to an exemplary embodiment, and FIG. 11 illustrates a cross-sectional view taken along a line XI-XI' in FIG. 10. FIG. 10 illustrates the layout view of one pixel area in the first region A1. The layout view of one pixel area in the second region A2 is described below with reference to FIG. 12.

Referring to FIG. 10, the emissive display device according to an exemplary embodiment includes the scan line 151 extending in the first direction D1 and transmitting the scan signal Sn, the previous scan line 152 transmitting the previous scan signal S(n−1), the light emission control line 153 transmitting the light emission control signal EM, and the initialization voltage line 127 transmitting the initialization voltage Vint. The bypass signal GB is transmitted through the previous scan line 152.

The emissive display device includes the data line 171 extending in the second direction D2 crossing the first direction D1 and transmitting the data voltage Dm, and the driving voltage line 172 transmitting the driving voltage ELVDD.

The emissive display device includes the driving transistor T1, the second transistor T2, the third transistor T3, the fourth transistor T4, the fifth transistor T5, the sixth transistor T6, the seventh transistor T7, the storage capacitor Cst, and the light emitting diode LED.

Each channel of the driving transistor T1, the second transistor T2, the third transistor T3, the fourth transistor T4, the fifth transistor T5, the sixth transistor T6, and the seventh transistor T7 may be in a semiconductor layer 130 that is elongated. Also, at least part among the first electrode and the second electrode of the plurality of transistors T1, T2, T3, T4, T5, T6, and T7 may be in the semiconductor layer 130. The semiconductor layer 130 (a portion where a shadow is added in FIG. 10) may be formed and bent into various shapes. The semiconductor layer 130 may include a polycrystalline semiconductor such as polysilicon, or an oxide semiconductor.

The semiconductor layer 130 includes a channel doped with an N-type impurity or a P-type impurity, and a first doping region and a second doping region positioned at respective sides of the channel and having a higher doping concentration than the impurity doped to the channel. The first doping region and the second doping region correspond to the first and second electrodes of the plurality of transistors T1, T2, T3, T4, T5, T6, and T7, respectively. If one of the first doping region and the second doping region is the source region, the other may be the drain region. Also, in the semiconductor layer 130, a region between the first electrode and the second electrode of the different transistors may be doped such that the source electrode of one transistor and the drain electrode of the other transistor may be electrically connected to each other.

Each of the channels of the transistors T1, T2, T3, T4, T5, T6, and T7 overlaps the gate electrode of each of the transistors T1, T2, T3, T4, T1, T2, T3, T4, T5, T6, and T7, and is disposed between the first electrode and the second electrode of each of the transistors T1, T2, T3, T4, T5, T6, and T7. The plurality of transistors T1, T2, T3, T4, T5, T6, and T7 may have substantially the same stacked structure. Hereinafter, the driving transistor T1 is mainly described in detail, and the rest of the transistors T2 to T7 are schematically described.

The driving transistor T1 includes a channel, a first gate electrode 155, a first electrode S1, and a second electrode D1. The channel of the driving transistor T1 is between the first electrode S1 and the second electrode D1, and overlaps the first gate electrode 155 in a plan view. The channel may not be bent, and the W/L value of the channel in the first region A1 may be larger than the W/L value of another pixel in the second region A2, as described in FIG. 1. For example, the length of the channel of the driving transistor T1 in the first region A1 may be shorter than the length of the channel in the second region A2, and the width of the channel therein may be wider than that in the second region.

The first gate electrode 155 overlaps the channel in a plan view. The first electrode S1 and the second electrode D1 are disposed on both sides of the channel, respectively. Above the first gate electrode 155, an extended portion of a storage line 126 is disposed to be isolated. The extended portion of storage line 126 overlaps the gate electrode 155 in a plan view via the second gate insulating layer to form the storage capacitor Cst. The extended portion of the storage line 126 is the first storage electrode of the storage capacitor Cst (E1 of FIG. 8), and the first gate electrode 155 is the second storage electrode (E2 of FIG. 8). The extended portion of the storage line 126 is formed with an opening 56 so that the first gate electrode 155 may be connected to a first data connecting member 71. The first data connecting member 71 and the top surface of the first gate electrode 155 are electrically connected via a contact hole 61 in the opening 56. The first data connecting member 71 is connected to the second electrode D3 of the third transistor T3 to connect the gate electrode 155 of the driving transistor T1 to the second electrode D3 of the third transistor T3.

The gate electrode of the second transistor T2 may be a part of the scan line 151. The data line 171 is connected to the first electrode S2 of the second transistor T2 through a contact hole 62. The first electrode S2 and the second electrode D2 may be disposed on the semiconductor layer 130.

The third transistor T3 may be composed of two transistors adjacent to each other. In the pixel PX of FIG. 10, the T3 indication is shown on the left and the lower side with respect to the folded portion of the semiconductor layer 130. Each of these two parts plays the role of the third transistor T3, and has a structure in which the first electrode S3 of one third transistor T3 is connected to the second electrode D3 of the other third transistor T3. The gate electrode of two transistors T3 may be a part of the scan line 151 or a part protruded upward from the scan line 151. Such a structure may be referred to as a dual gate structure, and performs a role of preventing a leakage current from flowing. The first electrode S3 of the third transistor T3 is connected to the first electrode S6 of the sixth transistor T6 and the second electrode D1 of the driving transistor T1. The second electrode D3 of the third transistor T3 is connected to the first data connecting member 71 through a contact hole 63.

The fourth transistor T4 also includes two fourth transistors T4, and the two fourth transistors T4 are formed at the part where the previous scan line 152 and the semiconductor layer 130 meet. The gate electrode of the fourth transistor T4 may be a part of the previous scan line 152. There is a structure in which the first electrode S4 of one fourth transistor T4 is connected to the second electrode D4 of the other fourth transistor T4. Such a structure may be referred to as the dual gate structure, and has a function of preventing a leakage current from flowing. A second data connecting member 72 is connected to the first electrode S4 of the fourth transistor T4 through a contact hole 65, and the first data connecting member 71 is connected to the second electrode D4 of the fourth transistor T4 through the contact hole 63.

As described above, by using the dual gate structure of the third transistor T3 and the fourth transistor T4, an electron moving path of the channel is blocked in an off state, thereby effectively preventing the leakage current from being generated.

The gate electrode of the fifth transistor T5 may be a part of the light emission control line 153. The driving voltage line 172 is connected to the first electrode S5 through the fifth transistor T5 through a contact hole 67, and the second electrode D5 is connected to the first electrode S1 of the driving transistor T1 through the semiconductor layer 130.

The gate electrode of the sixth transistor T6 may be a part of the light emission control line 153. A third data connecting member 73 is connected to the second electrode D6 through the sixth transistor T6 through a contact hole 69, and the first electrode S6 is connected to the second electrode D1 of the driving transistor through the semiconductor layer 130.

The gate electrode of the seventh transistor T7 may be a part of the previous scan line 152. The first electrode S7 of the seventh transistor T7 is connected to the second electrode D6 of the sixth transistor T6, and the second electrode D7 is connected to the first electrode S4 of the fourth transistor T4.

The storage capacitor Cst includes the first storage electrode E1 and the second storage electrode E2 overlapping via a second gate insulating layer 142. The second storage electrode E2 may correspond to the gate electrode 155 of the driving transistor T1, and the first storage electrode E1 may be the extended portion of the storage line 126. Here, the second gate insulating layer 142 becomes a dielectric material, and the capacitance is determined by the charge charged in the storage capacitor Cst and the voltage between the first and second storage electrodes E1 and E2. By using the first gate electrode 155 as the second storage electrode E2, a space for forming the storage capacitor Cst can be secured in the space narrowed by the channel of the driving transistor T1 occupying a large area within the pixel.

The driving voltage line 172 is connected to the first storage electrode E1 through a contact hole 68. Thus, the storage capacitor Cst stores the charge corresponding to the difference between the driving voltage ELVDD transmitted to the first storage electrode E1 through the driving voltage line 172 and the gate voltage Vg of the gate electrode 155.

The second data connecting member 72 is connected to the initialization voltage line 127 through a contact hole 64. The first electrode is connected to the third data connecting member 73 through a contact hole 81. The first electrode may be a pixel electrode.

A parasitic capacitor control pattern 79 may be formed between the dual gate electrodes of the compensation transistor T3. There is a parasitic capacitor inside the pixel, and the image quality characteristic may change if the voltage applied to the parasitic capacitor changes. The driving voltage line 172 is connected to the parasitic capacitor control pattern 79 via the contact hole 66. As a result, it is possible to prevent the image quality characteristic from being changed by applying the driving voltage ELVDD having a constant DC voltage to the parasitic capacitor. The parasitic capacitor control pattern 79 may be disposed in a different region than shown, or may be applied with a voltage other than the driving voltage ELVDD.

One terminal of the first data connecting member 71 is connected to the gate electrode 155 through the contact hole 61, and the other terminal is connected to the second electrode D3 of the third transistor T3 and the second electrode D4 of the fourth transistor T4 through the contact hole 63.

One terminal of the second data connecting member 72 is connected to the first electrode S4 of the fourth transistor T4 through the contact hole 65, and the other terminal is connected to the initialization voltage line 127 through the contact hole 64.

The third data connecting member 73 is connected to the second electrode of the sixth transistor T6 via the contact hole 69.

Hereinafter, the cross-sectional structures of the emissive display device according to an exemplary embodiment will be described in the stacked order with reference to FIG. 11 in addition to FIG. 10.

The emissive display device according to an exemplary embodiment includes the first substrate 110.

The first substrate 110 may include a plastic layer and a barrier layer. The plastic layer and the barrier layer may be alternately stacked.

The plastic layer may include, e.g., polyether sulfone (PES), polyacrylate (PAR), polyether imide (PEI), polyethylene naphthalate (PEN), poly(ethylene terephthalate) (PET), polyphenylene sulfide (PPS), polyarylate, polyimide (PI), polycarbonate (PC), poly(arylene ether sulfone), or combinations thereof.

The barrier layer may include a suitable inorganic material, e.g., a silicon oxide, a silicon nitride, or an aluminum oxide.

A buffer layer 112 may be on a first substrate 110. The buffer layer 112 may include an inorganic insulating material such as a silicon oxide, a silicon nitride, an aluminum oxide, or an organic insulating material such as a polyimide acryl.

The semiconductor layer 130 including the channel, the first electrode, and the second electrode of the plurality of transistors T1, T2, T3, T4, T5, T6, and T7 may be on the buffer layer 112.

A first gate insulating layer 141 may cover the semiconductor layer 130. A first gate conductor including the first gate electrode 155, the scan line 151, the previous scan line 152, and the light emission control line 153 may be on the first gate insulating layer 141.

The second gate insulating layer 142 may cover the first gate conductor. The first gate insulating layer 141 and the second gate insulating layer 142 may include the inorganic insulating material such as a silicon nitride, a silicon oxide, and an aluminum oxide, or the organic insulating material.

A second gate conductor including the storage line 126, the initialization voltage line 127, and the parasitic capacitor control pattern 79 may be on the second gate insulating layer 142.

An interlayer insulating layer 160 covering the second gate conductor may be on the second gate conductor. The interlayer insulating layer 160 may include the inorganic insulating material such as a silicon nitride, a silicon oxide, and an aluminum oxide, or may include the organic insulating material.

A data conductor including the data line 171, the driving voltage line 172, the first data connecting member 71, the second data connecting member 72, and the third data connecting member 73 may be on the interlayer insulating layer 160. The first data connecting member 71 may be connected to the first gate electrode 155 through the contact hole 61.

A passivation layer 180 covering the data conductor is disposed thereon. The passivation layer 180 may be a planarization layer, and may include the organic insulating material or the inorganic insulating material.

A first electrode 191 may be on the passivation layer 180. The first electrode 191 may be connected to the third data connecting member 73 via the contact hole 81 formed in the passivation layer 180.

A partition 350 may be located on the passivation layer 180 and the first electrode 191. The partition 350 has openings 351 overlapping first electrode 191. An emission layer 370 may be in the openings 351. A second electrode 270 may be on the emission layer 370 and the partition 350. The first electrode 191, the emission layer 370, and the second electrode 270 may form the light-emitting diode LED. The first electrode 191 may be a pixel electrode, and the second electrode 270 may be a common electrode.

According to an exemplary embodiment, the pixel electrode may be an anode, which is a hole injection electrode, and the common electrode may be a cathode, which is an electron injection electrode. Conversely, the pixel electrode may be a cathode, and the common electrode may be the anode. When holes and electrons are injected from the pixel electrode and the common electrode into the emission layer, an exciton, in which the holes and electrons are combined, is emitted when being dropped from an excited state to a ground state.

An encapsulation layer 400 protecting the light-emitting diode LED may be on the second electrode 270. The encapsulation layer 400 may be in contact with the second electrode 270 as shown, or may be spaced apart from the second electrode 270 according to an exemplary embodiment.

The encapsulation layer 400 may be a thin film encapsulation layer in which an inorganic film and an organic film are stacked, and may include a triple layer composed of the inorganic film, the organic film, and the inorganic film. According to an exemplary embodiment, a capping layer and a functional layer may be located between the second electrode 270 and the encapsulation layer 400.

Figure 12:
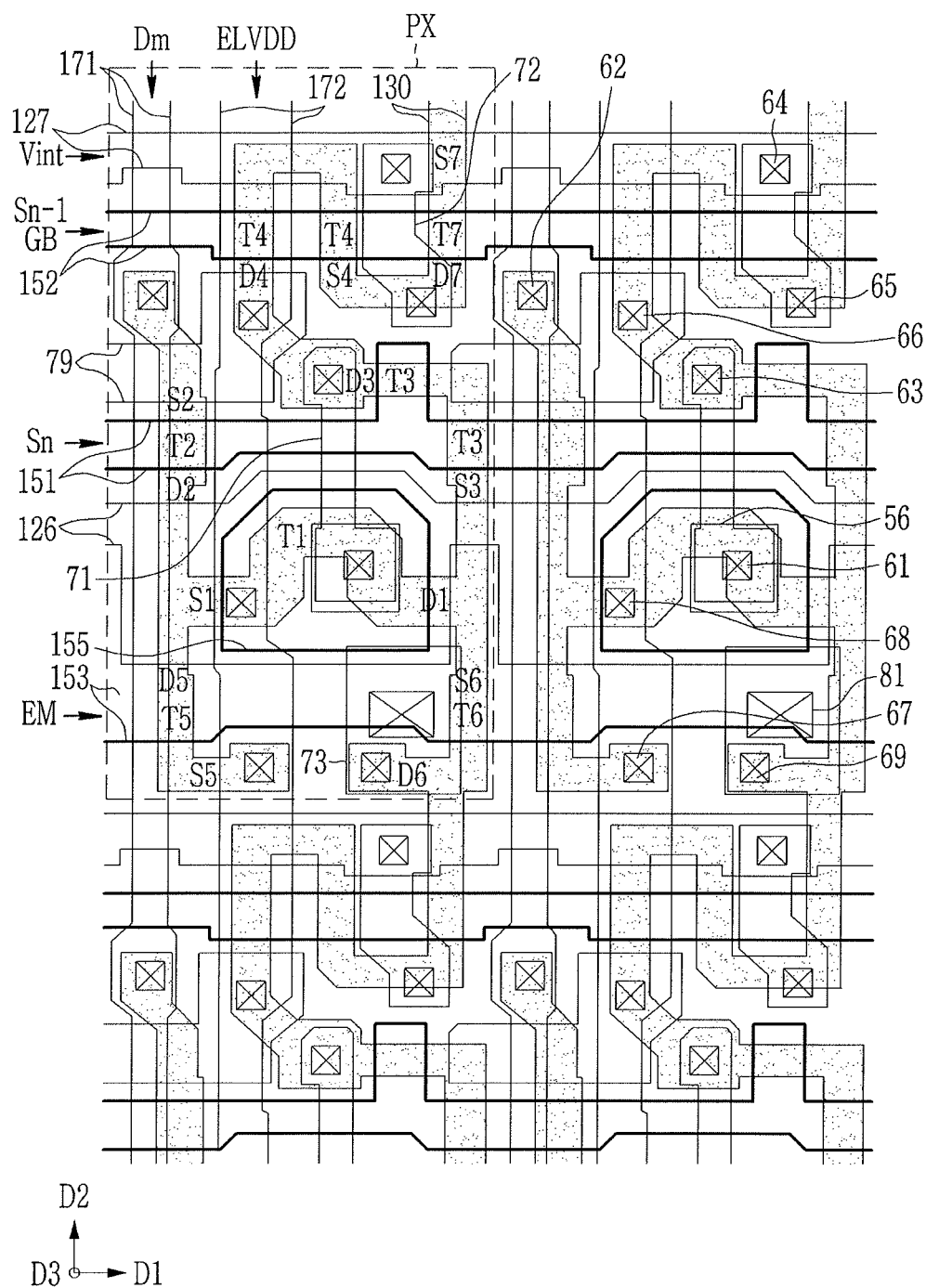
FIG. 12 illustrates a layout view showing a pixel in a second region.

Next, the arrangement of the pixel in the second region A2 is described. FIG. 12 illustrates a layout view showing a pixel in a second region A2. Referring to FIG. 12, the arrangement structure of the pixel in the second region A2 may be the same as the arrangement structure of the pixel described in FIG. 10, except for the channel shape of the driving transistor T1. A detailed description of the same constituent elements may be omitted. Referring to FIG. 12, the driving transistor T1 in the second region A2 may have a bent channel. As the length of the channel becomes longer, the driving range of the gate voltage Vg applied to the first gate electrode 155 of the driving transistor T1 may be widened and the driving current Id is constantly increased according to the gate voltage Vg. As a result, by varying the magnitude of the gate voltage Vg, the gray of the light emitted by the light emitting diode LED may be controlled more precisely and the display quality of the emissive display device may be improved.

The channel of the driving transistor in the second region A2 may be bent, and the W/L value of the channel of the driving transistor in the first region A1 may be greater than the W/L value of the channel of the driving transistor in the second region A2.

Therefore, the luminance deterioration due to the low pixel density of the first region A1 may be compensated for by the increasing of the luminance of the light-emitting element by increasing the W/L value of the driving transistor of the first region A1. For example, the first region A1 may have a smaller number of pixels than the second region A2, but the luminance difference of the first region A1 and the second region A2 may be minimized because the luminance of pixels in the first region A1 may be relatively high.

In an implementation, as illustrated in FIG. 10, the channel region of the driving transistor T1 of the first region A1 may be a straight line without bending. In an implementation, the shape of the channel region of the driving transistor T1 of the first region A1 may be changed as long as it has a structure such that the W/L value increases compared with the W/L value of the channel of the driving transistor T1 of the second region A1.

Figure 13:
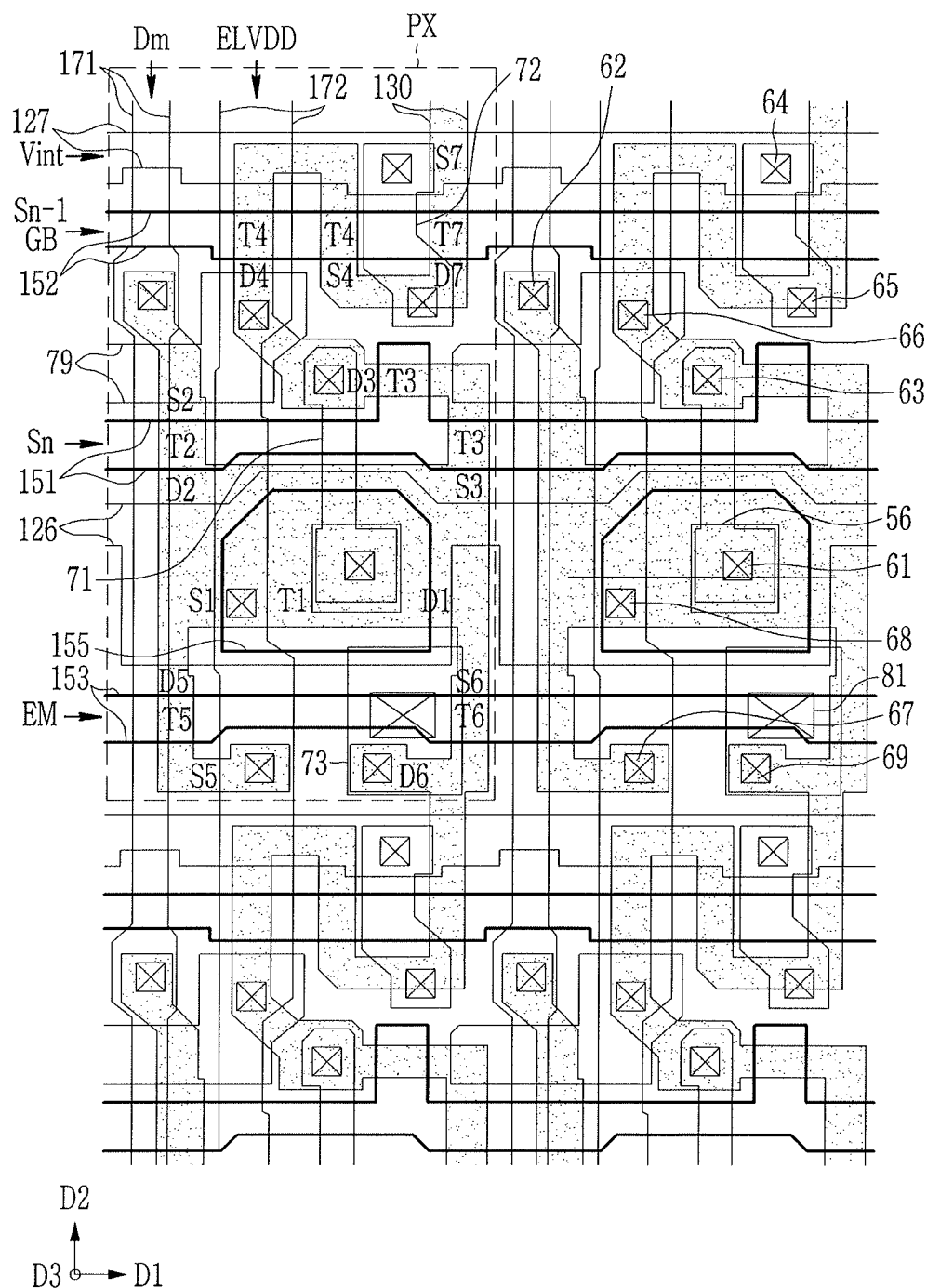
FIG. 13 illustrates a layout view of a pixel in a first region according to another exemplary embodiment.

FIG. 13 illustrates a layout view of a pixel in a first region A1 according to another exemplary embodiment. Referring to FIG. 13, the arrangement of the pixel according to the present exemplary embodiment is the same as the arrangement structure of the pixel described in FIG. 10, except for the channel shape of the driving transistor T1. A detailed description of the same constituent elements may be omitted. Referring to FIG. 13, in the display device according to the present exemplary embodiment, the driving transistor T1 of the first region A1 may have a wide channel width. For example, compared with FIG. 10, the channel length of the driving transistor T1 may be the same, but the channel width may be widened. In this case, the current amount flowing in the driving transistor T1 may be further increased, and the luminance of the light-emitting element may be higher. In the exemplary embodiment of FIG. 13, similar to the exemplary embodiment of FIG. 10, the luminance increase effect of the light-emitting element is shown, but the luminance rise width is larger.

Figure 14:
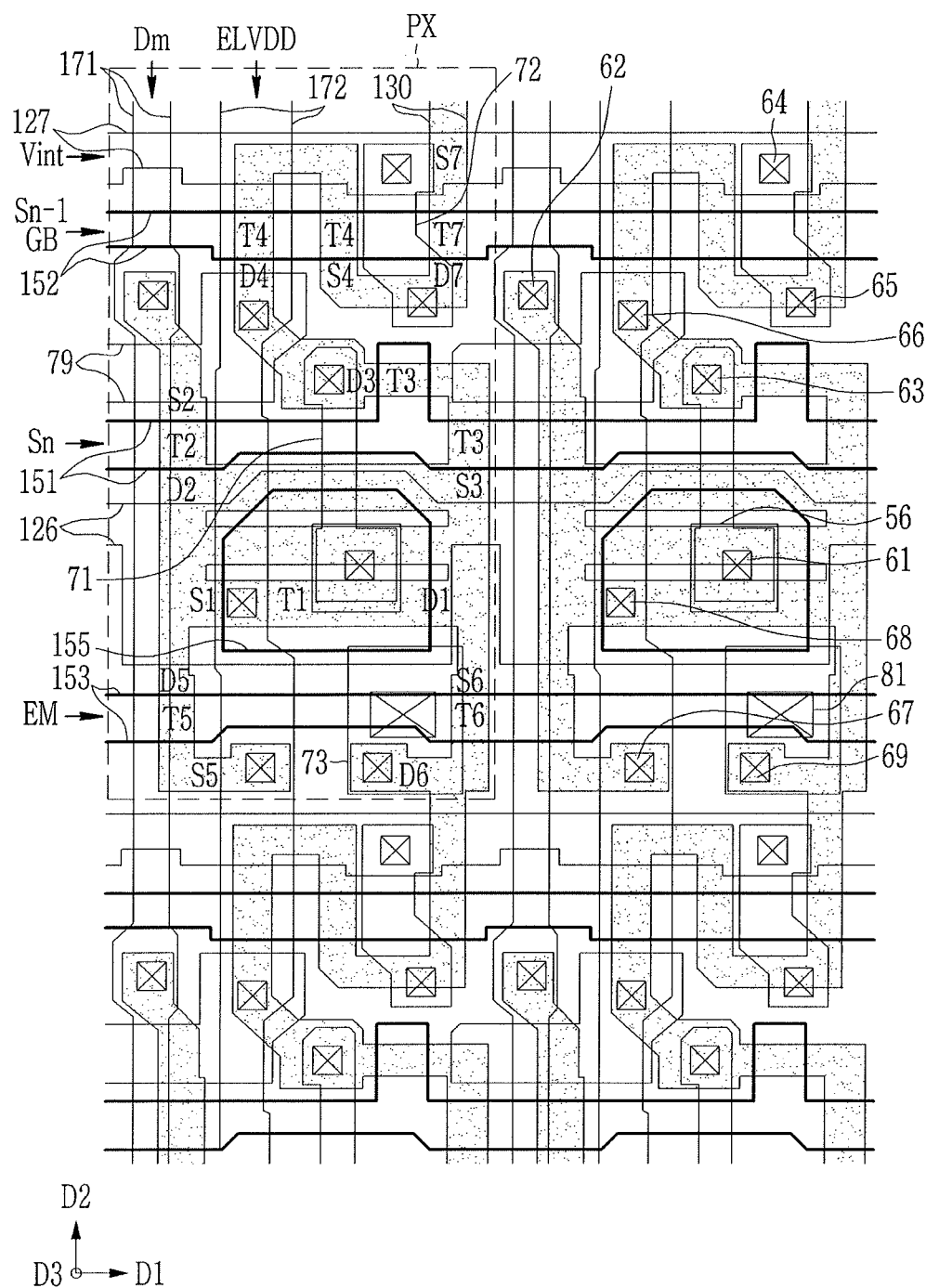
FIG. 14 illustrates a layout view of a pixel in a first region according to another exemplary embodiment.

FIG. 14 illustrates a layout view of a pixel disposed in a first region A1 according to another exemplary embodiment. Referring to FIG. 14, the arrangement of the pixel according to the present exemplary embodiment is the same as the arrangement structure of the pixel described in FIG. 13, except for the channel shape of the driving transistor T1. A detailed description of the same constituent elements may be omitted. Referring to FIG. 14, in the display device according to the present exemplary embodiment, the driving transistor T1 of the first region A1 may have a wide channel width and a part of the channel may be removed. In this way, the width and length of the channel region may be the same as that in FIG. 13 even if part of the channel is removed, so the luminance increasing effect of the same as or a similar level to the exemplary embodiment of FIG. 13 may be obtained.

Various exemplary embodiments of the channel shape of the driving transistor T1 of the pixel disposed in the first region A1 have been described above. In an implementation, a structure having a larger W/L value than a W/L value of the channel of the driving transistor T1 of the second region A1 may be included.

Figure 15:
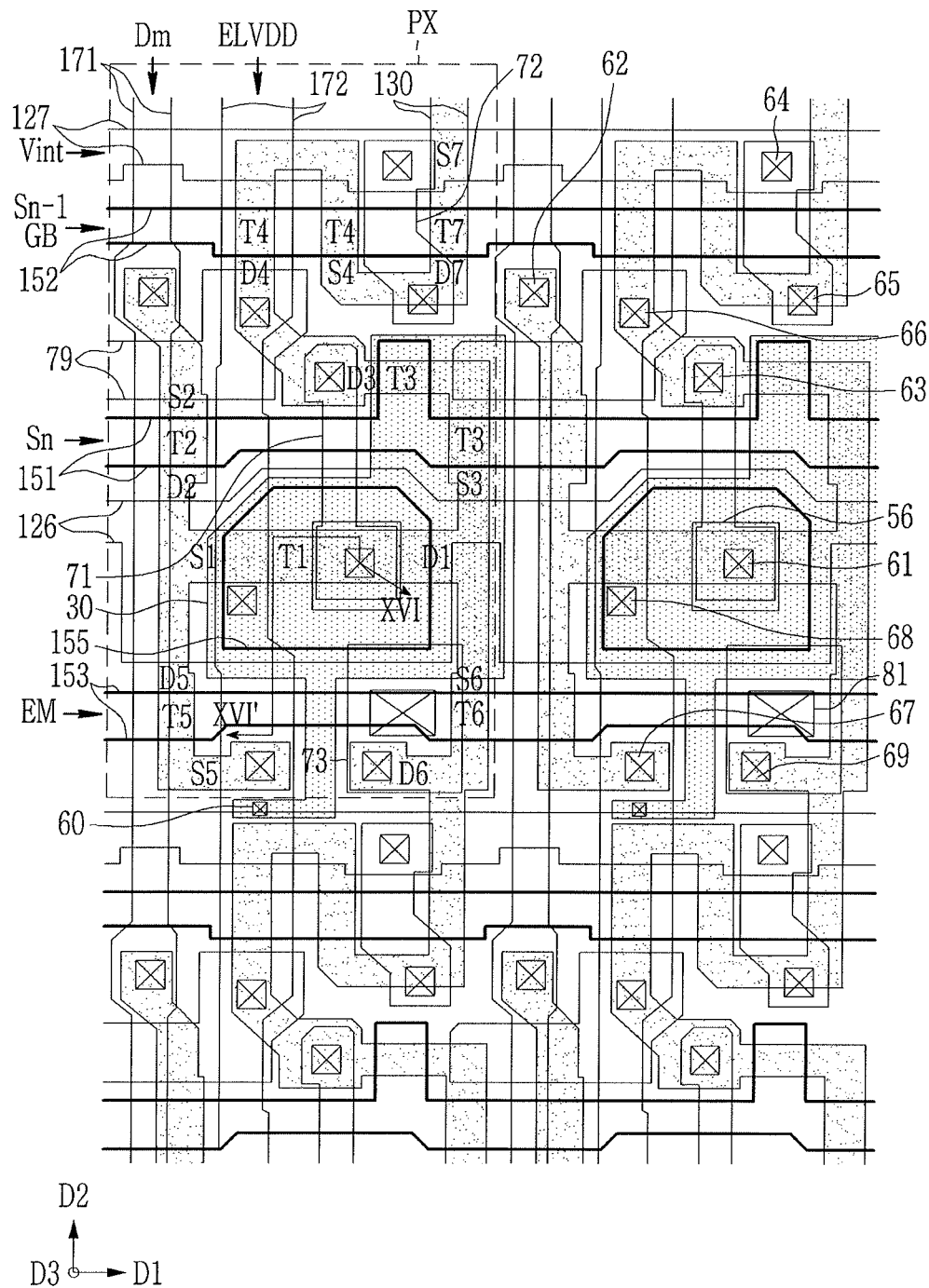
FIG. 15 illustrates a layout view of a pixel in a first region in a display device according to an exemplary embodiment.
Figure 16:
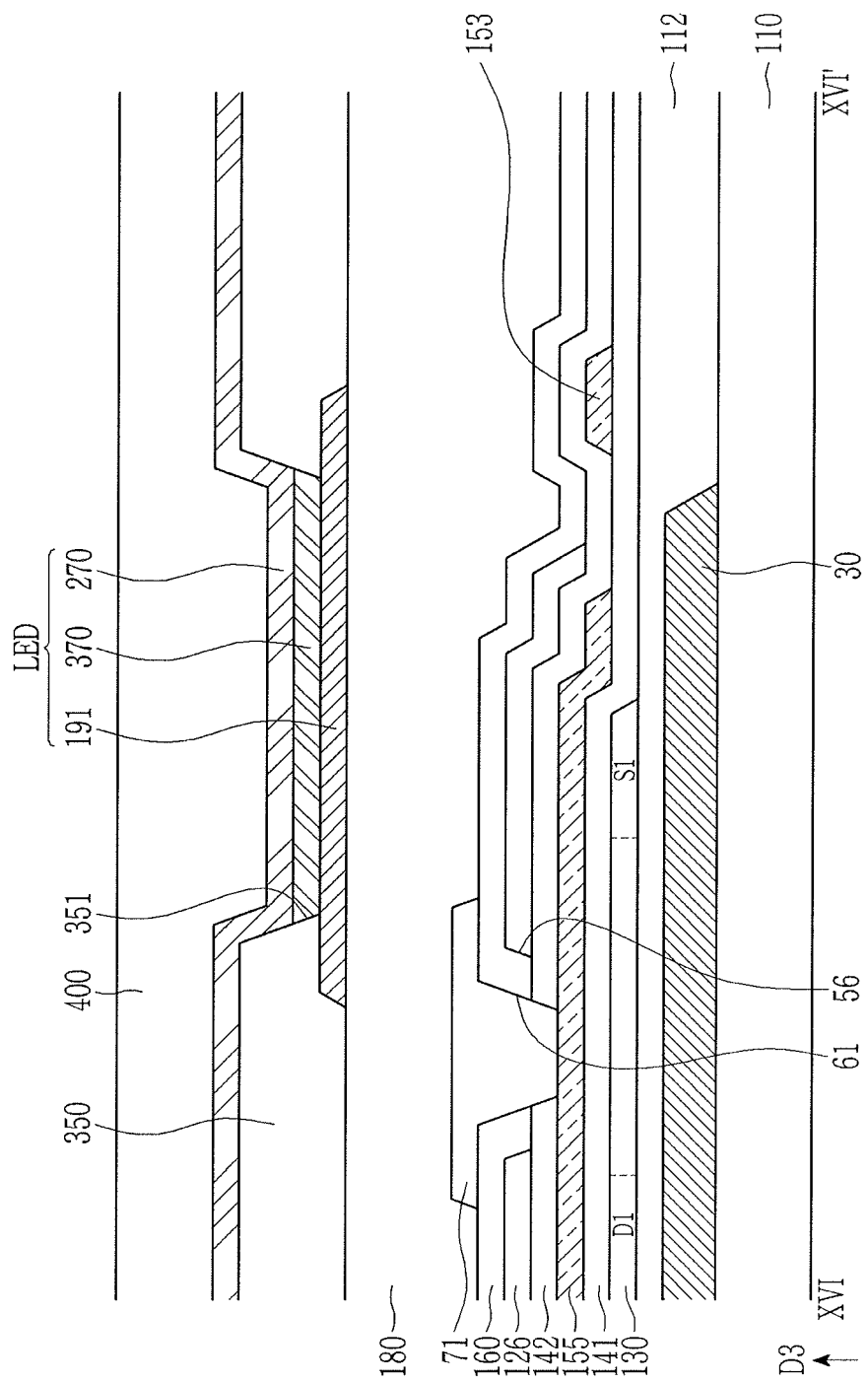
FIG. 16 illustrates a cross-sectional view taken along a line XVI-XVI' of FIG. 15.

Hereinafter, the display device according to another exemplary embodiment will be described. FIG. 15 illustrates a layout view of a pixel disposed in a first region A1 in a display device according to an exemplary embodiment. FIG. 16 illustrates a cross-sectional view taken along a line XVI-XVI' of FIG. 15.

Referring to FIG. 15 and FIG. 16, the display device according to the present exemplary embodiment is the same as the exemplary embodiment of FIG. 10 and FIG. 11, except for the configuration of a light blocking layer 30. A detailed description of the same constituent elements may be omitted.

Referring to FIG. 15, the display device according to the present exemplary embodiment may include a light blocking layer 30. The light blocking layer 30 may be connected to the driving voltage line 172 via a contact hole 60. The light blocking layer 30 may overlap the driving transistor T1 and the third transistor T3 in a plan view. The light blocking layer 30 in FIG. 15 is shown as shaded. The light blocking layer 30 may be between the first substrate 110 and the semiconductor layer 130 to block light from entering or being incident on the semiconductor layer 130.

The first region A1 may overlap with the sensing module 1200, and may be a region through which infrared rays are transmitted. These infrared rays could change the leakage current amount flowing in the transistors and the current amount flowing in the transistors in turn-off state. Therefore, the light-emitting element in the first region A1 could emit light with different luminance due to the influence of transmitted infrared rays.

However, the display device according to the present exemplary embodiment may include the light blocking layer 30 in the region overlapping the driving transistor T1 and the third transistor T3 of the first region A1, thereby minimizing the leakage current variation of the transistor due to infrared ray transmission.

The light blocking layer 30 may be a layer for blocking infrared rays. In an implementation, the light blocking layer 30 may block both infrared rays and visible rays. In an implementation, the light blocking layer 30 may be a layer that transmits visible rays and blocks only infrared rays. In the present exemplary embodiment, the light blocking layer 30 may be only under the driving transistor T1 and the third transistor T3, which are largely influenced by the leakage current, so that the characteristic variation of the transistor due to transmission of the infrared rays may be prevented without greatly reducing the infrared ray transmittance. In the case of the driving transistor T1, the metal layer may be present and the transmittance of the infrared rays may be low, and the decreasing of the infrared ray transmittance due to the addition of the light blocking layer 30 may not be significant.

Referring to FIG. 15, the light blocking layer 30 may be connected to the driving voltage line 172. In an implementation, the light blocking layer 30 may be connected to the scan line 151, the previous scan line 152, the light emission control line 153, and the data line 171.

Referring to FIG. 16, the description for FIG. 16 is the same as the exemplary embodiment of FIG. 11 except for further including the light blocking layer 30. A detailed description of the same constituent elements may be omitted. For example, referring to FIG. 16, the light blocking layer 30 may be between the first substrate 110 and the semiconductor layer 130. The light blocking layer 30 may be between the first substrate 110 and the buffer layer 112.

Figure 17:
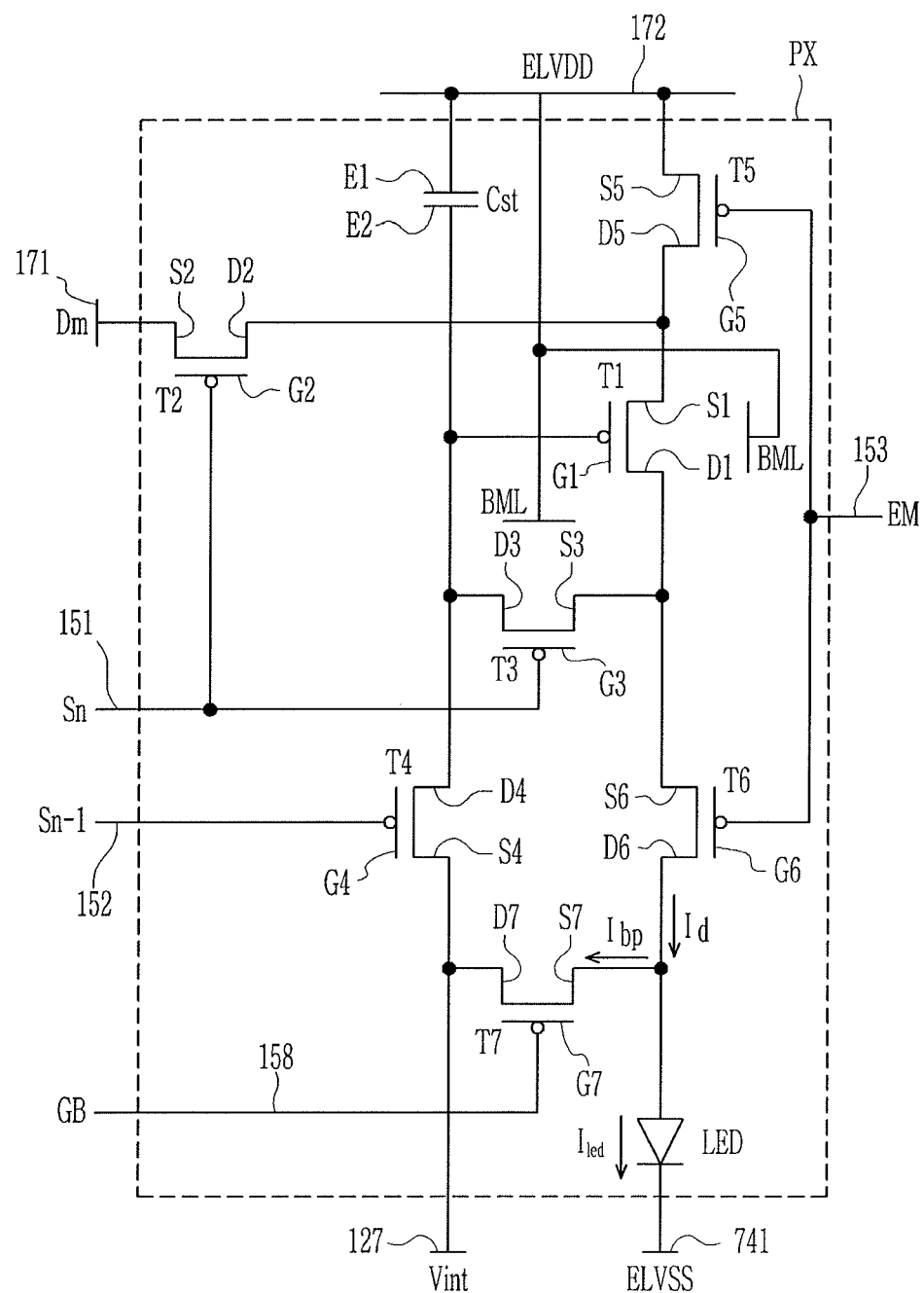
FIG. 17 illustrates an equivalent circuit diagram of one pixel of an emissive display device according to an exemplary embodiment of FIG. 15.

FIG. 17 illustrates an equivalent circuit diagram of one pixel of an emissive display device according to an exemplary embodiment of FIG. 15. Referring to FIG. 17, the present exemplary embodiment is the same as the description in FIG. 8 except for a light blocking layer BML connected to the ELVDD and overlapping the driving transistor T1 and the third transistor T3. A detailed description of the same constituent elements may be omitted.

In this embodiment, the light blocking layer 30 may be only in the first region A1 and not in the second region A2. As the first region A1 is the infrared ray transmitting region, the light blocking layer 30 to block the infrared rays is required, but since the second region A2 does not transmit the infrared rays, so a light blocking layer 30 may not be needed to block the infrared rays.

Figure 18:
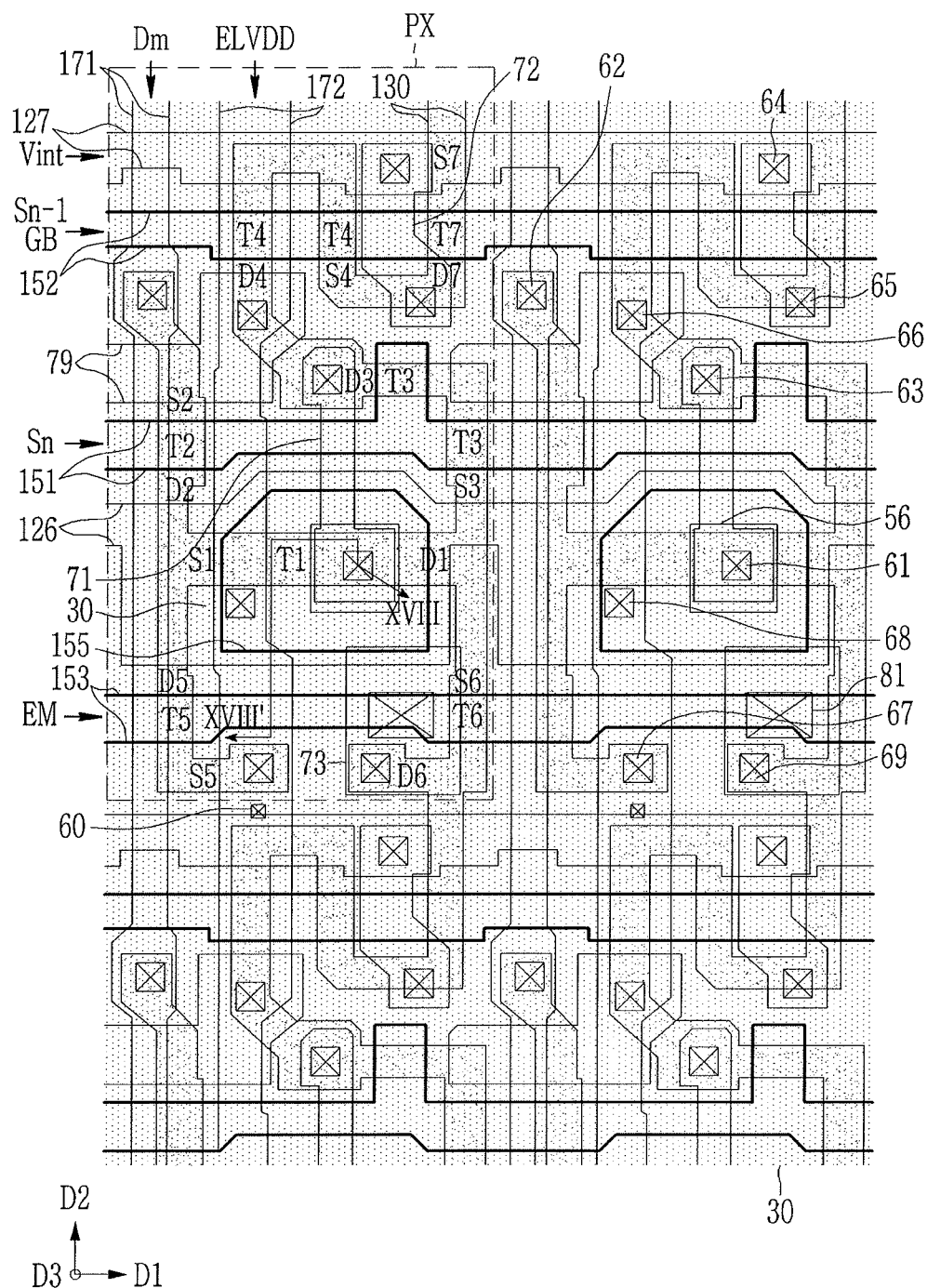
FIG. 18 illustrates a layout view of a pixel of a first region in a display device according to another exemplary embodiment.
Figure 19:
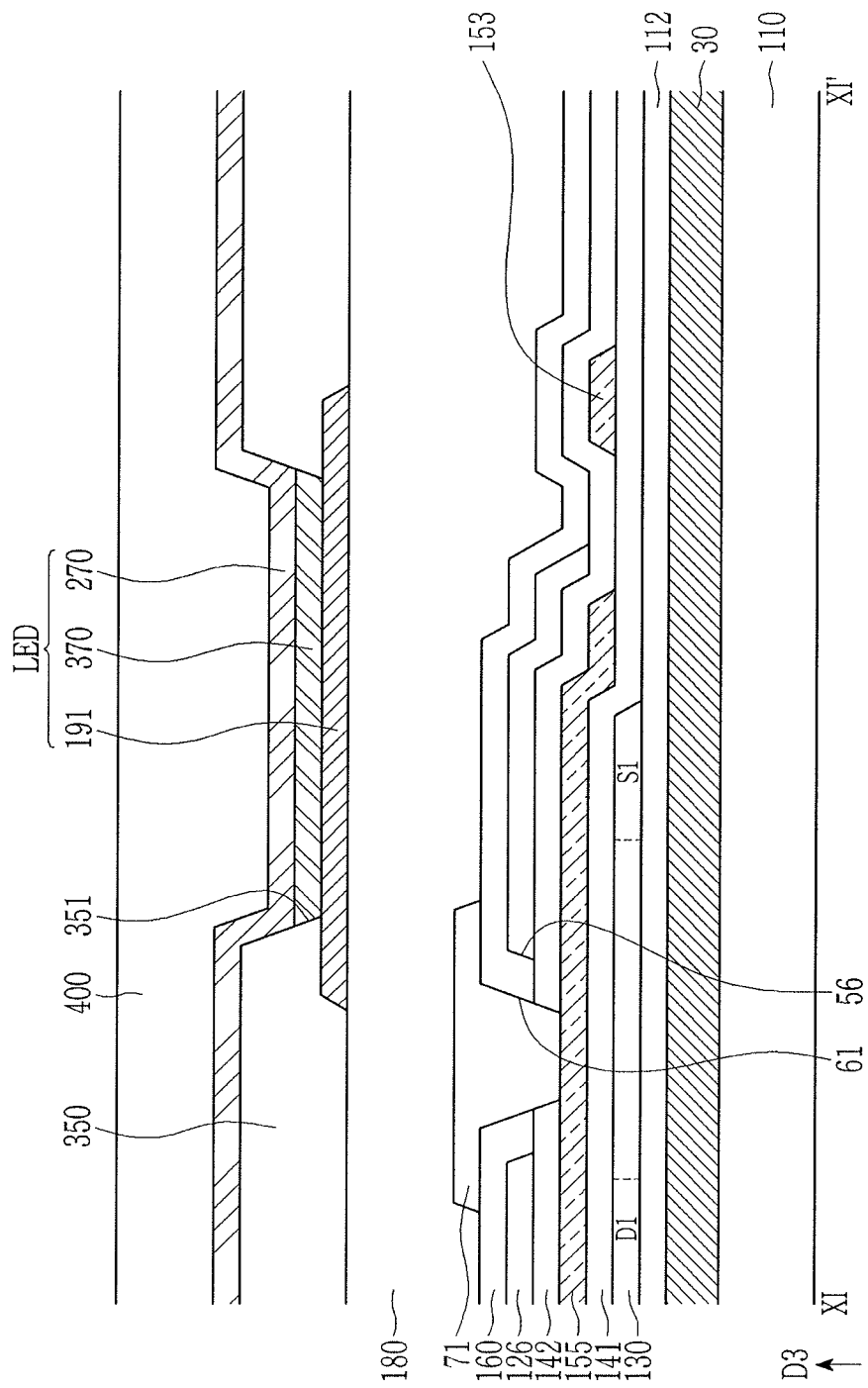
FIG. 19 illustrates a cross-sectional view taken along a line XVIII-XIIII' of FIG. 18.
Figure 20:
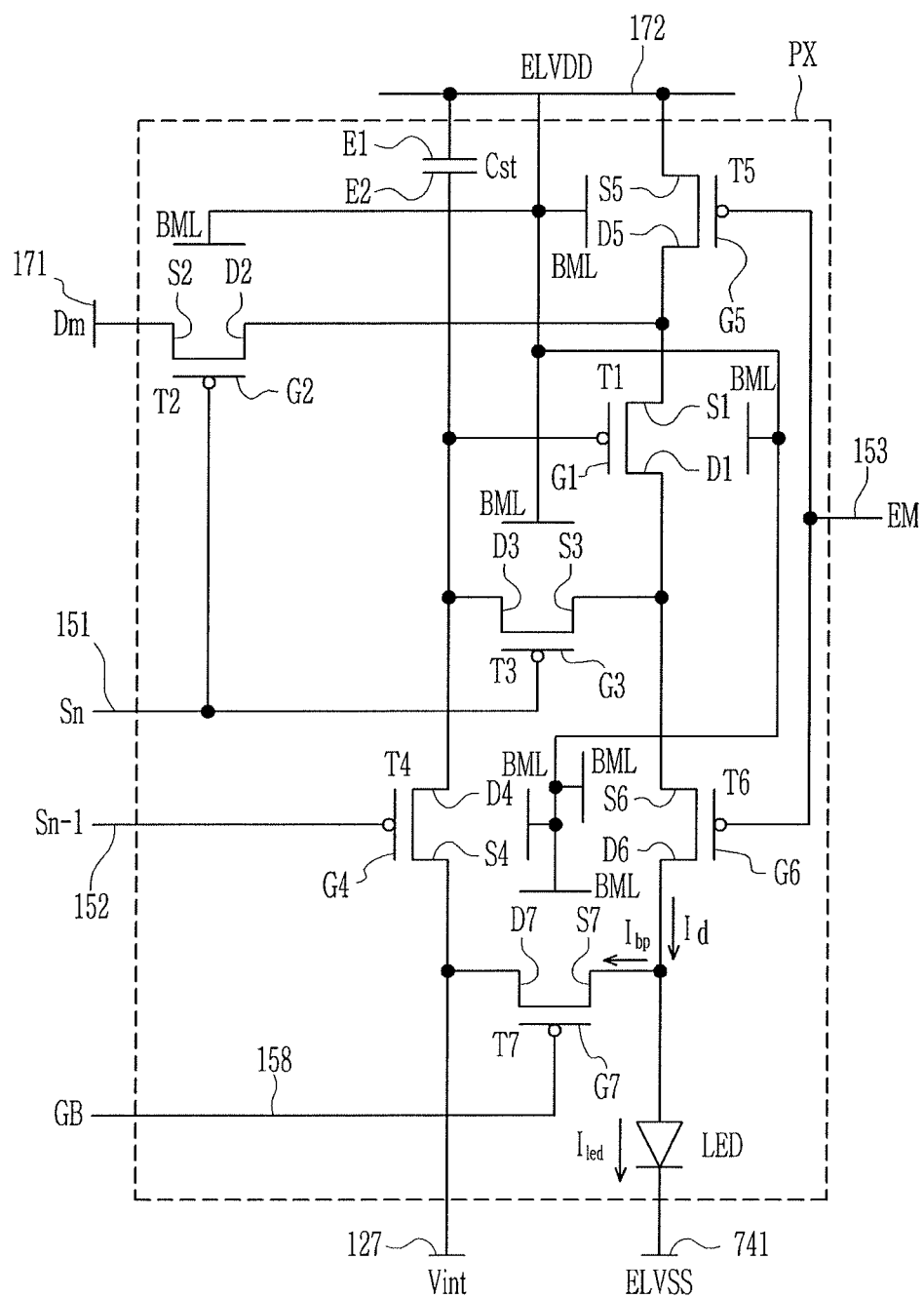
FIG. 20 illustrates an equivalent circuit diagram of one pixel of an emissive display device according to an exemplary embodiment of FIG. 18.

FIG. 18 illustrates a layout view of a pixel of a first region A1 in a display device according to another exemplary embodiment. FIG. 19 illustrates a cross-sectional view taken along a line XVIII-XIIII' of FIG. 18. FIG. 20 illustrates an equivalent circuit diagram of one pixel of an emissive display device according to an exemplary embodiment of FIG. 18. Referring to FIG. 18 and FIG. 19, the display device according to the present exemplary embodiment is the same as the exemplary embodiment of FIG. 15 and FIG. 16, except for the light blocking layer 30 on the pixel's entire surface. A detailed description of the same constituent elements may be omitted.

For example, referring to FIG. 18, the light blocking layer 30 may be connected to the driving voltage line 172 through the contact hole 60. In the present exemplary embodiment, the light blocking layer 30 may overlap the seven transistors. In this case, it is possible to effectively prevent the leakage current change and the luminance change of the transistor due to transmission of the infrared rays. However, as all the pixels in the first region A1 have the structure shown in FIG. 18, the infrared rays may not be transmitted, and only some of the pixels of the first region A1 may have the structure shown in FIG. 18.

Referring to FIG. 19, in the display device according to the present exemplary embodiment, the light blocking layer 30 may be on the entire pixel surface. Also, referring to FIG. 20, the light blocking layer 30 connected to the driving voltage line 172 may overlap all transistors and storage capacitors. In an implementation, the light blocking layer 30 may be connected to the scan line 151, the previous scan line 152, the light emission control line 153, and the data line 171.

Figure 21:
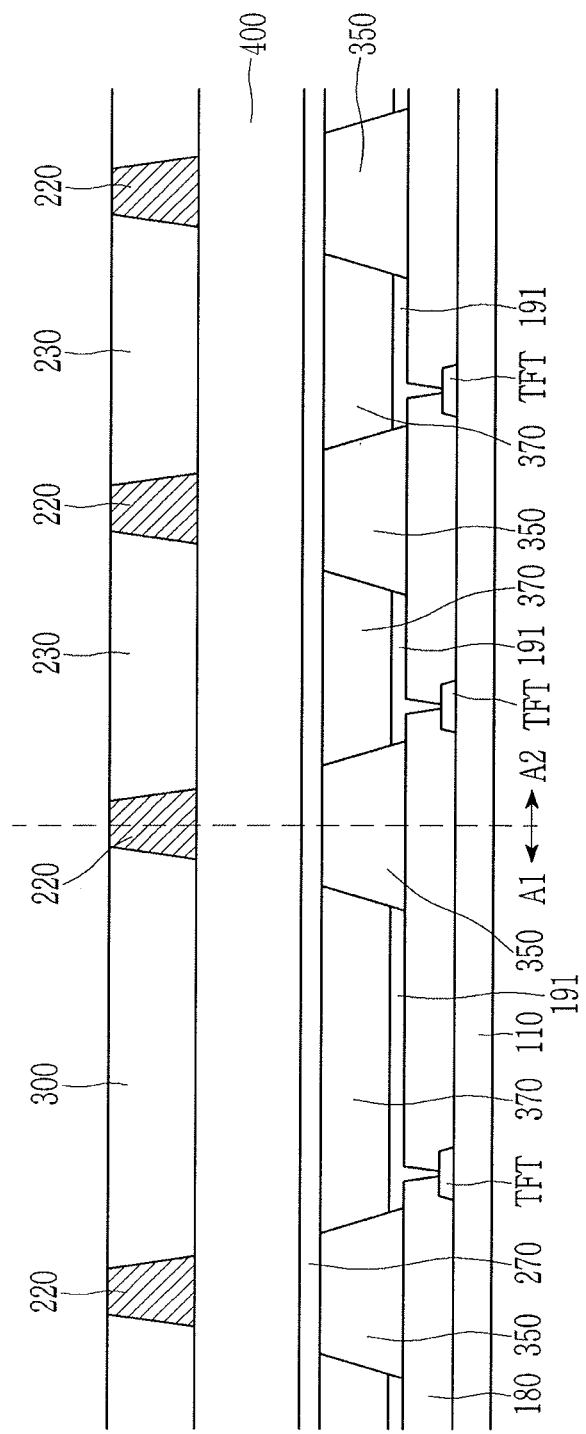
FIG. 21 illustrates a view simply showing a transistor and a light-emitting element of a first region and a second region in a display device according to an exemplary embodiment.

FIG. 21 illustrates a view simply showing a transistor and a light-emitting element of a first region A1 and a second region A2 in a display device according to an exemplary embodiment. Referring to FIG. 21, the display device may include the display area 100 and a color filter region 200.

The cross-sectional structure of the display area 100 may actually be the same as that shown in FIG. 10 and FIG. 11, however it is simplified in FIG. 21 for better comprehension and ease of description. For example, the display area 100 may include the transistor TFT in the first substrate 110 and the first electrode 191 connected to the transistor TFT. The passivation layer 180 may be between the first electrode 191 and the transistor TFT. The partition 350 may be on the passivation layer 180 and the first electrode 191, the partition 350 may have the opening overlapping the first electrode 191, and the emission layer 370 may be in the opening 191. The second electrode 270 may be on the emission layer 370 and the partition 350. The encapsulation layer 400 may be on the second electrode 270.

A color filter layer 230, a transparent layer 300, and a light blocking member 220 may be on the encapsulation layer 400. The light blocking member 220 may be between the color filter layer 230 and the transparent layer 300. The light blocking member 220 may overlap the partition 350, and the color filter layer 230 and the transparent layer 300 may overlap the emission layer 370.

Referring to FIG. 21, the color filter layer 230 may not be on the first region A1. Instead, the transparent layer 300 may be therein. This structure may help compensate for the reduction of the luminance, as the luminance of the first region A1 may be decreased due the first region A1 having a lower pixel density than the second region A2.

For example, as the light emitted in the second region A2 passes through the color filter layer 230, the luminance thereof may decrease. Therefore, by applying the transparent layer 300 instead of the color filter layer 230 in the first region A1, the luminance reduction in the first region A1 may be compensated for, and the first region A1 and the second region A2 may have similar luminance.

The structure of FIG. 21 may be further applied to the above-described exemplary embodiments. For example, the W/L value of the channel of the driving transistor of the first region A1 may be made larger than that of the second region A2, and simultaneously the color filter layer above the first region A1 may be removed. In addition, the W/L value of the channel of the driving transistor of the first region A1 may be made larger than that of the second region A2, and the color filter layer above the first region A1 may be removed while the light blocking layer is applied to some or all of the pixels located in the first region A1, By way of summation and review, as a bezel of the display device becomes thinner, the sight line of the user may be fixed or focused on the image (or the screen of the display device). In recent years, a front display technology that removes the bezel from the front of the display device, rearranges the infrared ray sensor on the front (or the bezel), and displays the image on the entire front of the display device has been developed.

One or more embodiments may provide a display device for minimizing a luminance difference by differentiating a channel size of a transistor in an infrared ray sensor overlapping region and a non-overlapping region.

One or more embodiments may provide a display device for minimizing a luminance difference in a sensor overlapping region and a non-overlapping region in the display device in which the sensor is on the rear surface of the display device.

According to exemplary embodiments, a display device with a minimized luminance difference may be provided by differentiating the channel size of the transistor in the sensor overlapping region and the non-overlapping region.

DESCRIPTION OF SYMBOLS

| | |
|---|---|
| 2000: display panel | 1200: sensing module |
| A1: first region | A2: second region |
| 30: light blocking layer | 300: transparent layer |
| 110: first substrate | 112: buffer layer |
| 130: semiconductor layer | 141: first gate insulating layer |
| 142: second gate insulating layer | 160: interlayer insulating layer |
| 180: passivation layer | 127: initialization voltage line |
| 126: storage line | 152: previous scan line |
| 151: scan line | 155: gate electrode |
| 153: light emission control line | 171: data line |
| 158: bypass control line | 71, 72, 73: data connecting member |
| 172: driving voltage line | |
| 741: common voltage line | E1, E2: storage electrode |
| T1, T2, T3, T4, T5, T6, T7: transistor | |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a display panel including a plurality of transistors and displaying an image on a front surface thereof; and
   a sensing module on a rear surface of the display panel,
   wherein:
   the display panel includes a first region that overlaps the sensing module and a second region that does not overlap the sensing module,
   the transistors in the second region each include a bent region between a source and a drain, and the transistors in the first region do not include a bent region, and
   the number of transistors with bent regions is greater than the number of transistors with non-bent regions.

2. The display device as claimed in claim 1, wherein the one transistor in the first region and the other transistor in the second region are driving transistors.

3. The display device as claimed in claim 1, wherein:
the display panel includes a plurality of pixels, and
a pixel density of the first region is smaller than a pixel density of the second region.

4. The display device as claimed in claim 3, wherein the pixel density of the first region is 20% to 90% of the pixel density of the second region.

5. The display device as claimed in claim 1, wherein the first region includes a transmitting region.

6. The display device as claimed in claim 5, wherein an area occupied by a transmitting region is 20% to 90% of a total area of the first region.

7. The display device as claimed in claim 1, wherein the display panel further includes:
- a first substrate on which the plurality of transistors are disposed, and
- a light blocking layer between the first substrate and at least one transistor of the plurality of transistors.

8. The display device as claimed in claim 7, wherein the light blocking layer blocks infrared rays.

9. The display device as claimed in claim 7, wherein the light blocking layer is in the first region and not in the second region.

10. The display device as claimed in claim 9, wherein:
in the first region, the plurality of transistors include a driving transistor, a switching transistor, and a compensation transistor, and
the light blocking layer overlaps the driving transistor and the switching transistor and does not overlap the compensation transistor.

11. The display device as claimed in claim 9, wherein:
in the first region, the plurality of transistors include a driving transistor, a switching transistor, and a compensation transistor, and
the light blocking layer overlaps all of the driving transistor, the switching transistor, and the compensation transistor.

12. The display device as claimed in claim 1, further comprising a color filter layer on the front surface of the display panel, wherein the color filter layer does not overlap the first region.

13. The display device as claimed in claim 12, further comprising a transparent layer overlapping the first region.

14. The display device as claimed in claim 1, wherein a luminance of a pixel in the first region is higher than a luminance of a pixel in the second region.

* * * * *